(12) United States Patent
Krishnan et al.

(10) Patent No.: US 10,438,795 B2
(45) Date of Patent: Oct. 8, 2019

(54) SELF-CENTERING WAFER CARRIER SYSTEM FOR CHEMICAL VAPOR DEPOSITION

(71) Applicant: Veeco Instruments, Inc., Plainview, NY (US)

(72) Inventors: Sandeep Krishnan, Jersey City, NJ (US); Alexander I. Gurary, Bridgewater, NJ (US); Chenghung Paul Chang, Easton, PA (US); Earl Marcelo, Franklin Park, NJ (US)

(73) Assignee: Veeco Instruments, Inc., Plainview, NY (US)

( * ) Notice: Subject to any disclaimer, the term of this patent is extended or adjusted under 35 U.S.C. 154(b) by 524 days.

(21) Appl. No.: 15/178,723

(22) Filed: Jun. 10, 2016

(65) Prior Publication Data
US 2016/0372321 A1    Dec. 22, 2016

Related U.S. Application Data

(60) Provisional application No. 62/298,540, filed on Feb. 23, 2016, provisional application No. 62/241,482,
(Continued)

(51) Int. Cl.
*C23C 16/46* (2006.01)
*H01L 21/02* (2006.01)
(Continued)

(52) U.S. Cl.
CPC ...... *H01L 21/0262* (2013.01); *C23C 16/4584* (2013.01); *C23C 16/4585* (2013.01);
(Continued)

(58) Field of Classification Search
CPC ....... H01L 21/205; H01L 21/68; H01L 21/02; H01L 21/677; C23C 16/46; C23C 16/4584
See application file for complete search history.

(56) References Cited

U.S. PATENT DOCUMENTS

D404,372 S     1/1999  Ishii
6,893,507 B2   5/2005  Goodman et al.
(Continued)

FOREIGN PATENT DOCUMENTS

CN       1901154 A      1/2007
CN     201732778 U      2/2011
(Continued)

OTHER PUBLICATIONS

"Notice of Allowance" for Japanese Design Application No. 2016-8299, dated May 15, 2017, 1 page, Japanese Intellectual Property Office, Japan.
(Continued)

*Primary Examiner* — Robert M Kunemund
(74) *Attorney, Agent, or Firm* — Kurt Rauschenbach; Rauschenbach Patent Law Group, LLC

(57) ABSTRACT

A self-centering wafer carrier system for a chemical vapor deposition (CVD) reactor includes a wafer carrier comprising an edge. The wafer carrier at least partially supports a wafer for CVD processing. A rotating tube comprises an edge that supports the wafer carrier during processing. An edge geometry of the wafer carrier and an edge geometry of the rotating tube being chosen to provide a coincident alignment of a central axis of the wafer carrier and a rotation axis of the rotating tube during process at a desired process temperature.

40 Claims, 29 Drawing Sheets

Related U.S. Application Data filed on Oct. 14, 2015, provisional application No. 62/183,166, filed on Jun. 22, 2015.

(51) Int. Cl.
| | |
|---|---|
| *H01L 21/67* | (2006.01) |
| *H01L 21/687* | (2006.01) |
| *C23C 16/458* | (2006.01) |
| *C23C 16/455* | (2006.01) |
| *H01L 21/285* | (2006.01) |

(52) U.S. Cl.
CPC ........ *C23C 16/46* (2013.01); *H01L 21/67098* (2013.01); *H01L 21/67103* (2013.01); *H01L 21/67109* (2013.01); *H01L 21/68735* (2013.01); *H01L 21/68757* (2013.01); *H01L 21/68785* (2013.01); *H01L 21/68792* (2013.01); *C23C 16/455* (2013.01); *H01L 21/02271* (2013.01); *H01L 21/28556* (2013.01)

(56) References Cited

U.S. PATENT DOCUMENTS

| | | | |
|---|---|---|---|
| 9,064,696 B2* | 6/2015 | Yasuhara | ............ C23C 16/4583 |
| 2003/0029571 A1 | 2/2003 | Goodman et al. | |
| 2009/0165721 A1 | 7/2009 | Pitney et al. | |
| 2010/0186666 A1* | 7/2010 | Kappeler | ............ C23C 16/4583 |
| | | | 118/641 |
| 2012/0042823 A1 | 2/2012 | Gatchalian et al. | |
| 2012/0108081 A1 | 5/2012 | Olgado et al. | |
| 2013/0269613 A1 | 10/2013 | Sanchez et al. | |
| 2014/0261187 A1 | 9/2014 | Krishnan et al. | |
| 2014/0283748 A1 | 9/2014 | Higashi et al. | |
| 2014/0366803 A1 | 12/2014 | Yamada et al. | |
| 2014/0370691 A1 | 12/2014 | Yamada et al. | |
| 2015/0007766 A1 | 1/2015 | Yamada et al. | |
| 2015/0011077 A1 | 1/2015 | Yamada et al. | |
| 2015/0013594 A1 | 1/2015 | Yamada et al. | |
| 2015/0024330 A1 | 1/2015 | Tian et al. | |
| 2015/0259827 A1 | 9/2015 | Yang et al. | |
| 2015/0267295 A1 | 9/2015 | Hill et al. | |

FOREIGN PATENT DOCUMENTS

| | | |
|---|---|---|
| CN | 102144280 A | 8/2011 |
| CN | 206127420 U | 4/2017 |
| JP | 2007-42844 | 2/2007 |
| JP | 200742844 A | 2/2007 |
| JP | 2010-129764 | 6/2010 |
| JP | 2010-534942 A | 11/2010 |
| JP | 2010534942 A | 11/2010 |
| JP | D1422467 | 8/2014 |
| JP | 104064490 A | 9/2014 |
| JP | D1545406 | 3/2016 |
| TW | D122891 | 5/2008 |
| TW | M431893 | 6/2012 |
| TW | M546004 | 7/2017 |
| WO | 99/23691 | 5/1999 |
| WO | 2013139288 A1 | 9/2013 |

OTHER PUBLICATIONS

"Office Action" for Korean Design Application No. 30-2016-0017744-M002, dated Mar. 28, 2017, 2 pages, Korean Intellectual Property Office.

"Office Action" for Korean Design Application No. 30-2016-0017744-M003, dated Mar. 28, 2017, 2 pages, Korean Intellectual Property Office.

"Office Action" for Korean Design Application No. 30-2016-0017744-M004, dated Mar. 28, 2017, 2 pages, Korean Intellectual Property Office.

"Office Action" for Taiwanese Design Application No. 105301932D01, dated Aug. 30, 2017, Taiwanese Intelligent Property Office, Taiwan.

Office Action for Taiwanese Design Application No. 105301929, dated Aug. 19, 2016, 2 pages, Taiwanese Intellectual Property Office, Taiwan.

Office Action for Taiwanese Design Application No. 105301931, dated Aug. 19, 2016, 2 pages, Taiwanese Intellectual Property Office, Taiwan.

Office Action for Taiwanese Design Application No. 105301932, dated Aug. 19, 2016, 2 pages, Taiwanese Intellectual Property Office, Taiwan.

Search Report for Taiwanese Design Application No. 105301931, dated Aug. 19, 2016, 1 page, Taiwanese Intellectual Property Office, Taiwan.

Office Action for Korean Design Application No. 30-2016-0017743(M001), dated Oct. 28, 2016, 1 page, Korean Intellectual Property Office, Republic of Korea.

Office Action for Korean Design Application No. 30-2016-0017743(M002), dated Oct. 28, 2016, 1 page, Korean Intellectual Property Office, Republic of Korea.

Office Action for Korean Design Application No. 30-2016-0017743(M003), dated Oct. 28, 2016, 1 page, Korean Intellectual Property Office, Republic of Korea.

Office Action for Korean Design Application No. 30-2016-0017743(M004), dated Oct. 28, 2016, 1 page, Korean Intellectual Property Office, Republic of Korea.

Office Action for Korean Design Application No. 30-2016-0017743(M005), dated Oct. 28, 2016, 1 page, Korean Intellectual Property Office, Republic of Korea.

Office Action for Korean Design Application No. 30-2016-0017744(M001), dated Oct. 28, 2016, 1 page, Korean Intellectual Property Office, Republic of Korea.

Office Action for Korean Design Application No. 30-2016-0017744(M002), dated Oct. 28, 2016, 1 page, Korean Intellectual Property Office, Republic of Korea.

Office Action for Korean Design Application No. 30-2016-0017744(M003), dated Oct. 28, 2016, 1 page, Korean Intellectual Property Office, Republic of Korea.

Office Action for Korean Design Application No. 30-2016-0017744(M004), dated Oct. 28, 2016, 1 page, Korean Intellectual Property Office, Republic of Korea.

Office Action for Korean Design Application No. 30-2016-0017745(M001), dated Oct. 28, 2016, 1 page, Korean Intellectual Property Office, Republic of Korea.

Office Action for Korean Design Application No. 30-2016-0017745(M002), dated Oct. 28, 2016, 1 page, Korean Intellectual Property Office, Republic of Korea.

Office Action for Japanese Design Application No. 2016-8299, dated Jun. 29, 2016, 2 pages, Japanese Intellectual Property Office, Japan.

Office Action for Japanese Design Application No. 2016-8300, dated Jun. 29, 2016, 2 pages, Japanese Intellectual Property Office, Japan.

Office Action for Japanese Design Application No. 2016-8301, dated Jun. 29, 2016, 2 pages, Japanese Intellectual Property Office, Japan.

Examination Report for European Community Design Application No. 003068774-001/003068774-0005, dated Jun. 25, 2016, 3 pages, European Union Intellectual Property Office, Alicante, Spain.

Examination Report for European Community Design Application No. 003068790-001/003068790-0004, dated Jun. 25, 2016, 2 pages, European Union Intellectual Property Office, Alicante, Spain.

Examination Report for European Community Design Application No. 003068253-001/003068253-0002, dated Jul. 4, 2016, 2 pages, European Union Intellectual Property Office, Alicante, Spain.

"Office Action" for Taiwanese Design Application No. 105301932, dated Jan. 10, 2017, 3 pages, Taiwanese Intellectual Property Office, Taiwan.

"Search Report" for Taiwanese Design Application No. 105301932, dated Jan. 9, 2017, 1 page, Taiwanese Intellectual Property Office, Taiwan.

(56) References Cited

OTHER PUBLICATIONS

"Office Action" for Taiwanese Design Application No. 105301932D01, dated Jan. 17, 2017, 3 pages, Taiwanese Intellectual Property Office, Taiwan.
"Search Report" for Taiwanese Design Application No. 105301932D01, dated Jan. 11, 2017, 1 page, Taiwanese Intellectual Property Office, Taiwan.
"Office Action" for Japanese Design Application No. 2016-16290, dated Jan. 4, 2017, 1 page, Japanese Intellectual Property Office, Japan.
"Instruction" for Japanese Design Application No. 2016-16290, Jan. 4, 2017, 2 pages, Japanese Intellectual Property Office, Japan.
"Office Action" for Japanese Design Application No. 2016-16291, dated Jan. 4, 2017, 1 page, Japanese Intellectual Property Office, Japan.
"Instruction" for Japanese Design Application No. 2016-16291, Jan. 4, 2017, 2 pages, Japanese Intellectual Property Office, Japan.
"Notice of Allowance" for Taiwanese Design Application No. 105301929, dated Jan. 12, 2017, 2 pages, Taiwanese Intellectual Property Office, Taiwan.
"Search Report" for Taiwanese Design Application No. 105301929, dated Jan. 9, 2017, 1 page, Taiwanese Intellectual Property Office, Taiwan.
"Office Action" for Chinese Utility Model Application No. 201620622524.9, dated Jan. 22, 2017, 1 page, Chinese Patent Office.
"Notice of Allowance" for Taiwanese Design Application No. 105301929D02, dated Feb. 18, 2017, 2 pages, Taiwanese Intellectual Property Office, Taiwan.
"Search Report" for Taiwanese Design Application No. 105301929D02, dated Jan. 16, 2017, 1 page, Taiwanese Intellectual Property Office, Taiwan.
"Notice of Allowance" for Taiwanese Design Application No. 105301929D01, dated Feb. 18, 2017, 2 pages, Taiwanese Intellectual Property Office, Taiwan.
"Search Report" for Taiwanese Design Application No. 105301929D01, dated Jan. 16, 2017, 1 page, Taiwanese Intellectual Property Office, Taiwan.
"Office Action" for Taiwanese Patent Application No. 105209388, dated Feb. 20, 2017, 2 pages, Taiwanese Intellectual Property Office, Taiwan.
"Office Action" for Japanese Design Application No. 2016-8299, dated Mar. 3, 2017, 2 pages, Japanese Intellectual Property Office, Japan.
"Notice of Allowance" for Taiwanese Design Application No. 105301931D01, dated Mar. 23, 2017, 2 pages, Taiwanese Intellectual Property Office, Taiwan.
"Office Action" for Korean Design Application No. 30-2016-0017743 M001, dated Mar. 28, 2017, 3 pages, Korean Intellectual Property Office, South Korea.
"Office Action" for Korean Design Application No. 30-2016-0017743 M003, dated Mar. 28, 2017, 3 pages, Korean Intellectual Property Office, South Korea.
"Office Action" for Korean Design Application No. 30-2016-0017743 M004, dated Mar. 28, 2017, 3 pages, Korean Intellectual Property Office, South Korea.
"Office Action" for Korean Design Application No. 30-2016-0017744-M001, dated Mar. 28, 2017, 2 pages, Korean Intellectual Property Office, Korea.
"Office Action" for Korean Design Application No. 30-2016-0017744-M002, dated Mar. 28, 2017, 2 pages, Korean Intellectual Property Office, Korea.
"Office Action" for Korean Design Application No. 30-2016-0017744-M003, dated Mar. 28, 2017, 2 pages, Korean Intellectual Property Office, Korea.
"Office Action" for Korean Design Application No. 30-2016-0017744-M004, dated Mar. 28, 2017, 2 pages, Korean Intellectual Property Office, Korea.
"Office Action" for Korean Design Application No. 30-2016-0017745-M001, dated Mar. 28, 2017, 3 pages, Korean Intellectual Property Office, Korea.
"Office Action" for Korean Design Application No. 30-2016-0017745-M002, dated Mar. 28, 2017, 3 pages, Korean Intellectual Property Office, Korea.
"Search Report" for German Utility Model Application No. 20-2016-003-843.6, dated May 24, 2017, 5 pages, German Patent Office, Germany.
"Notice of Allowance" for Taiwanese Patent Application No. 1050209388, dated May 31, 2017, 3 pages, Taiwanese Intellectual Property Office. Taiwan.
"Notification Concerning Transmittal of International Preliminary Report on Patentability (Chapter I of the Patent Cooperation Treaty)", for International Application No. PCT/US2016/037022, dated Jan. 4, 2018, 8 Pages, The International Bureau of WIPO, Geneva, Switzerland.
"Notice of Allowance", for Taiwanese Design Patent Application No. 105301932, dated Dec. 4, 2017, 3 Pages, Taiwanese Intellectual Property Office, Taiwan.
"Notice of Allowance", for Taiwanese Design Patent Application No. 105301932D01, dated Dec. 4, 2017, 3 Pages, Taiwanese Intellectual Property, Taiwan.
"Notice of Allowance" for Korean Design Application No. 30-2016-0017743[M004], dated Oct. 13, 2017, 2 pages, Korean Intellectual Property Office, Republic of Korea.
"Notification of Transmittal of the International Search Report and the Written Opinion of the International Searching Authority, or the Declaration" for PCT/US2016/037022 dated Sep. 13, 2016, 11 pages, the International Searching Authority/Korean Intellectual Property Office, Daejeon, Republic of Korea.
"Office Action" for Chinese Patent Application No. 201620622524. 9, dated Oct. 31, 2016, State of Intellectual Property of the People's Republic of China, Beijing, China
"Notice of Allowance" for Taiwanese Design Patent Application No. 105301929D03, dated Jun. 19, 2017, Taiwanese Intellectual Property Office, Taiwan.
"Search Report" for Taiwanese Design Patent Application No. 105301929D03, dated Jan. 16, 2017, 1 page, Taiwanese Intellectual Property Office, Taiwan.
"Notice of Allowance" for Taiwanese Design Patent Application No. 105301929D04, dated Jun. 19, 2017, Taiwanese Intellectual Property Office, Taiwan.
"Search Report" for Taiwanese Design Patent Application No. 105301929D04, dated Jan. 16, 2017, 1 page, Taiwanese Intellectual Property Office, Taiwan.
"Notice of Allowance" for Taiwanese Design Patent Application No. 105301931D02, dated Jun. 19, 2017, Taiwanese Intellectual Property Office, Taiwan.
"Search Report" for Taiwanese Design Application No. 105301931D02, dated Jan. 16, 2017, 1 page, Taiwanese Intellectual Property Office, Taiwan.
"Notice of Allowance" for Taiwanese Design Patent Application No. 105301931D03, dated Jun. 19, 2017, Taiwanese Intellectual Property Office, Taiwan.
"Search Report" for Taiwanese Design Application No. 105301931D03, dated Jan. 16, 2017, 1 page, Taiwanese Intellectual Property Office, Taiwan.
"Office Action" for Taiwanese No. 105119600, 7 pages, dated Nov. 17, 2017, Intellectual Property Office, Taiwan.
"Search Report" for Taiwanese No. 105119600, 1 page, dated Nov. 8, 2017, Intellectual Property Office, Taiwan.
"Office Action of the Intellectual Property Office" for Taiwanese Patent Application No. 105119600, dated Aug. 14, 2018, 1 Page, the Intellectual Property Office, Taiwan.
"Office Action" for Chinese Design Application No. 201630149553. 3, 1 page, dated Jul. 19, 2016, State Intellectual Property Office of the People's Republic of China, Beijing, China.
"Notice of Allowance" for Korean Design application No. 30-2016-0017743[M001], dated Aug. 10, 2017, 2 pages, Korean Intellectual Property Office, Korea.

(56) References Cited

OTHER PUBLICATIONS

"Notice of Allowance" for Korean Design application No. 30-2016-0017743[M003], dated Jul. 24, 2017, 2 pages, Korean Intellectual Property Office, Korea.
"Notice of Allowance" for Korean Design application No. 30-2016-0017744[M001], dated Jul. 25, 2017, 2 pages, Korean Intellectual Property Office, Korea.
"Notice of Allowance" for Korean Design application No. 30-2016-0017744[M002], dated Jul. 25, 2017, 2 pages, Korean Intellectual Property Office, Korea.
"Notice of Allowance" for Korean Design application No. 30-2016-0017744[M003], dated Jul. 25, 2017, 2 pages, Korean Intellectual Property Office, Korea.
"Notice of Allowance" for Korean Design application No. 30-2016-0017744[M004], dated Jul. 25, 2017, 2 pages, Korean Intellectual Property Office, Korea.
"Notice of Allowance" for Korean Design application No. 30-2016-0017745[M001], dated Aug. 31, 2017, 2 pages, Korean Intellectual Property Office, Korea.
"Notice of Allowance" for Korean Design application No. 30-2016-0017745[M002], dated Aug. 31, 2017, 2 pages, Korean Intellectual Property Office, Korea.
"Office Action" for Taiwanese Patent Application No. 105301932, dated Aug. 30, 2017, 3 pages, Taiwanese Intellectual Property Office, Taiwan.
Notice of Allowance for Taiwanese Patent Application No. 105119600, 3 Pages, dated Nov. 30, 2018, Taiwanese Intellectual Property Office, Taiwan.
Correction Notice for Taiwanese Patent Application No. 105119600, 1 Page, dated Dec. 7, 2018, Taiwanese Intellectual Property Office, Taiwan.
"Search Report" for European Patent Application No. 16815048.0, dated Jan. 17, 2019, 8 pages, European Patent Office, Munich, Germany.
"Office Action" for Chinese Patent Application No. 201610457472.9, Mar. 28, 2019, 15 pages, State Intellectual Property Office of the People's Republic of China, China.

* cited by examiner

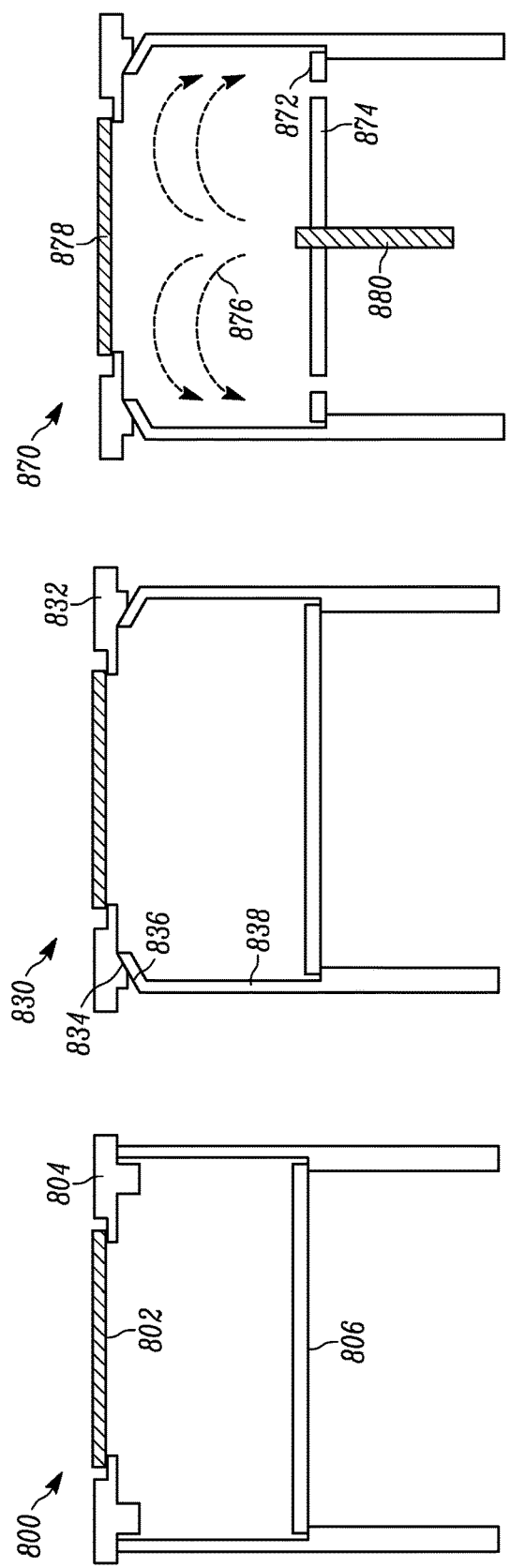

SELF-CENTERING WAFER CARRIER SYSTEM FOR CHEMICAL VAPOR DEPOSITION

CROSS REFERENCE TO RELATED APPLICATION

The present application is a non-provisional patent application of U.S. Provisional Patent Application No. 62/298,540 entitled "Self-Centering Wafer Carrier System for Chemical Vapor Deposition", filed on Feb. 23, 2016; U.S. Provisional Patent Application Ser. No. 62/241,482, entitled "Self-Centering Wafer Carrier System for Chemical Vapor Deposition", filed Oct. 14, 2015; and U.S. Provisional Patent Application Ser. No. 62/183,166, entitled "Self-Centering Wafer Carrier System for Chemical Vapor Deposition", filed Jun. 22, 2015. The entire contents of U.S. Provisional Patent Application Nos. 62/298,540, 62/241,482, 62/183,166 are herein incorporated by reference.

The section headings used herein are for organizational purposes only and should not be construed as limiting the subject matter described in the present application in any way.

INTRODUCTION

Many material processing systems include substrate carriers for supporting substrates during processing. The substrate is often a disc of crystalline material that is commonly called a wafer. One such type of material processing system is a vapor phase epitaxy (VPE) system. Vapor phase epitaxy is a type of chemical vapor deposition (CVD) which involves directing one or more gases containing chemical species onto a surface of a substrate so that the reactive species react and form a film on the surface of the substrate. For example, VPE can be used to grow compound semiconductor materials on substrates.

Materials are typically grown by injecting at least one precursor gas and, in many processes, at least a first and a second precursor gas into a process chamber containing the crystalline substrate. Compound semiconductors, such as III-V semiconductors, can be formed by growing various layers of semiconductor materials on a substrate using a hydride precursor gas and an organometallic precursor gas. Metalorganic vapor phase epitaxy (MOVPE) is a vapor deposition method that is commonly used to grow compound semiconductors using a surface reaction of metalorganics and hydrides containing the required chemical elements. For example, indium phosphide could be grown in a reactor on a substrate by introducing trimethylindium and phosphine.

Alternative names for MOVPE used in the art include organometallic vapor phase epitaxy (OMVPE), metalorganic chemical vapor deposition (MOCVD), and organometallic chemical vapor deposition (OMCVD). In these processes, the gases react with one another at the growth surface of a substrate, such as a sapphire, Si, GaAs, InP, InAs or GaP substrate, to form a III-V compound of the general formula $In_XGa_YAl_ZN_AAs_BP_CSb_D$, where X+Y+Z equals approximately one, A+B+C+D equals approximately one, and each of X, Y, Z, A, B, C, and D can be between zero and one. In various processes, the substrate can be a metal, semiconductor, or an insulating substrate. In some instances, bismuth may be used in place of some or all of the other Group III metals.

Compound semiconductors, such as III-V semiconductors, can also be formed by growing various layers of semiconductor materials on a substrate using a hydride or a halide precursor gas process. In one halide vapor phase epitaxy (HVPE) process, Group III nitrides (e.g., GaN, AlN) are formed by reacting hot gaseous metal chlorides (e.g., GaCl or AlCl) with ammonia gas ($NH_3$). The metal chlorides are generated by passing hot HCl gas over the hot Group III metals. One feature of HVPE is that it can have a very high growth rate, up to 100 µm per hour for some state-of-the-art processes. Another feature of HVPE is that it can be used to deposit relatively high quality films because films are grown in a carbon free environment and because the hot HCl gas provides a self-cleaning effect.

In these processes, the substrate is maintained at an elevated temperature within a reaction chamber. The precursor gases are typically mixed with inert carrier gases and are then directed into the reaction chamber. Typically, the gases are at a relatively low temperature when they are introduced into the reaction chamber. As the gases reach the hot substrate, their temperature, and hence their available energy for reaction, increases. Formation of the epitaxial layer occurs by final pyrolysis of the constituent chemicals at the substrate surface. Crystals are formed by a chemical reaction on the surface of the substrate and not by physical deposition processes. Consequently, VPE is a desirable growth technique for thermodynamically metastable alloys. Currently, VPE is commonly used for manufacturing laser diodes, solar cells, and light emitting diodes (LEDs) as well as power electronics.

It is highly desirable in CVD deposition to be able to deposit highly uniform films across the entire substrate. The presence of non-uniform temperature profiles across the substrate during deposition leads to non-uniform deposited films. Methods and apparatus that improve uniformity of the thermal profile across the substrate over the duration of the deposition are needed to improve yield.

SUMMARY OF THE INVENTION

A self-centering wafer carrier system for a chemical vapor deposition (CVD) reactor includes a wafer carrier comprising an edge that at least partially supports a wafer for CVD processing. The wafer carrier can support an entire bottom surface of the wafer or can only support a perimeter of the wafer, leaving a portion of both a top and a bottom surface of the wafer exposed during CVD processing.

The self-centering wafer carrier system also includes a rotating tube comprising an edge that supports the wafer carrier. In some embodiments, the rotating tube comprises a beveled edge and a flat rim. In general, the edge geometry of the wafer carrier and the edge geometry of the rotating tube are chosen to provide a coincident alignment of a central axis of the wafer carrier and a rotation axis of the rotating tube during processing at a desired process temperature. The coincident alignment can establish an axial-symmetrical temperature profile across the wafer. In some configurations and methods of operation of the wafer carrier, a rotation eccentricity of the wafer is substantially zero at the desired process temperature.

In some embodiments, the wafer carrier includes an edge geometry comprising a spacer. The spacer can be machined into the wafer carrier edge. In some embodiments, the wafer carrier edge geometry comprises at least two spacers that form a contact with the edge of the rotating tube. The spacer in the wafer carrier edge geometry forces both a center axis of the wafer carrier and an axis of rotation of the rotating tube to align at a desired process temperature. The spacer can be dimensioned so that the rotation of the wafer has a desired eccentricity. In some embodiments, a relief structure is formed into the wafer carrier edge, which shifts a center of mass of the wafer carrier. In one specific embodiment, the relief structure is a relatively flat section. The relief structure can be positioned opposite to the spacer.

In some embodiments, the geometry of the edge of the wafer carrier and the geometry of the edge of the rotating tube both defined matching bevel surfaces. In some specific embodiments, the matching bevel surfaces are parallel. In some specific embodiments, the edge geometry of the wafer carrier is beveled on an inner surface and the edge geometry of the rotating tube is beveled on outer surface, where the inner surface refers to a surface that faces toward the center of the chamber and the outer surface refers to a surface that faces away from the center of the chamber. In other embodiments, the edge geometry of the wafer carrier is beveled on an outer surface and the edge geometry of the rotating tube is beveled on inner surface. Also, in some specific embodiments, the bevel surface is at an angle, α, such that $\tan(\alpha) > f$, where f is a coefficient of friction between the wafer carrier and rotation tube.

In some embodiments, the wafer carrier edge and the rotating tube edge are positioned to define a gap. A width of the gap changes during heating due to a difference between a coefficient of thermal expansion of the material forming the wafer carrier and a coefficient of thermal expansion of the material forming the rotating tube. The width of the gap at room temperature is chosen so that there is space for expansion of the wafer carrier relative to the rotating tube at processing temperatures. In many embodiments, the width of the gap approaches zero at the desired process temperature. In addition, in some embodiments, the material forming at least one of the wafer carrier and the rotating tube is chosen to have a coefficient of thermal expansion that maintains space for expansion of the wafer carrier relative to the rotating tube at processing temperatures.

A heating element is positioned proximate to the wafer carrier to heat the wafer to the process temperature. In some embodiments, the heating element is positioned parallel to and under the wafer carrier. The heating element can be a multi-zone heating element that generates a spatially dependent temperature profile.

BRIEF DESCRIPTION OF THE DRAWINGS

The present teaching, in accordance with preferred and exemplary embodiments, together with further advantages thereof, is more particularly described in the following detailed description taken in conjunction with the accompanying drawings. The skilled person in the art will understand that the drawings, described below, are for illustration purposes only. The drawings are not necessarily to scale, emphasis instead generally being placed upon illustrating principles of the teaching. In the drawings, like reference characters generally refer to like features and structural elements throughout the various figures. The drawings are not intended to limit the scope of the Applicants' teaching in any way.

FIG. 8A illustrates an embodiment of a self-centering wafer carrier CVD system of the present teaching comprising an open-carrier design.

FIG. 8B illustrates an embodiment of a self-centering wafer carrier CVD system of the present teaching comprising an open-carrier design and a beveled edge.

FIG. 8C illustrates an embodiment of a self-centering wafer carrier CVD system of the present teaching comprising an open-carrier and positive purge design.

DESCRIPTION OF VARIOUS EMBODIMENTS

The present teaching will now be described in more detail with reference to exemplary embodiments thereof as shown in the accompanying drawings. Reference in the specification to "one embodiment" or "an embodiment" means that a particular feature, structure, or characteristic, described in connection with the embodiment is included in at least one embodiment of the teaching. The appearances of the phrase "in one embodiment" in various places in the specification are not necessarily all referring to the same embodiment.

While the present teachings are described in conjunction with various embodiments and examples, it is not intended that the present teachings be limited to such embodiments. On the contrary, the present teachings encompass various alternatives, modifications, and equivalents, as will be appreciated by those of skill in the art. Those of ordinary skill in the art, having access to the teaching herein, will recognize additional implementations, modifications, and embodiments, as well as other fields of use, which are within the scope of the present disclosure as described herein.

It should be understood that the individual steps used in the methods of the present teachings may be performed in any order and/or simultaneously, as long as the teaching remains operable. Furthermore, it should be understood that the apparatus and methods of the present teachings can include any number, or all, of the described embodiments, as long as the teaching remains operable.

The present teaching relates to methods and apparatuses for self-centering a wafer carrier for CVD and other types of processing reactors. Aspects of the present teaching are described in connection with a single wafer carrier. However, one skilled in the art will appreciate that many aspects of the present teachings are not limited to a single wafer carrier.

Figure 1:
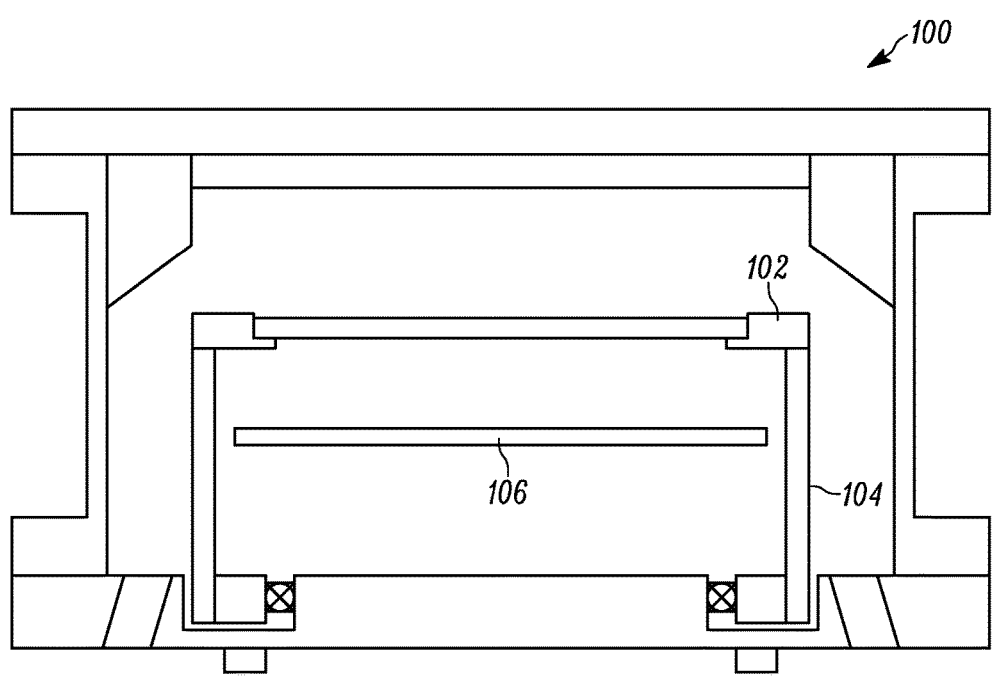
FIG. 1 illustrates one embodiment of a single wafer CVD reactor of the present teaching comprising a wafer carrier and rotating tube with heater assembly.

FIG. 1 illustrates one embodiment of a single wafer CVD reactor 100 of the present teaching comprising a wafer carrier 102 and rotating tube 104 with a multi-zone heater assembly 106. The wafer carrier 102 is supported at the perimeter by a rotating tube 104. A multi-zone heating assembly 106 is positioned under the wafer carrier 102 inside the rotating tube 104. In this configuration, there is a diametral gap between the wafer carrier 102 and the rotating tube 104 that allows for carrier loading. The width of this gap changes during heating because the wafer carrier 102 and the rotating tube 104 have different coefficients of thermal expansion (CTE) resulting in different expansions as a function of temperature.

Wafer carriers and rotating tubes can be formed from a variety of materials such as, for example, silicon carbide (SiC), boron nitride (BN), boron carbide (BC), aluminum nitride (AlN), alumina ($Al_2O_3$), sapphire, silicon, gallium nitride, gallium arsenide, quartz, graphite, graphite coated with silicon carbide (SiC), other ceramic materials, and combinations thereof. In addition, these and other materials can have a refractory coating, for example, a carbide, nitride or oxide refractory coating. Furthermore, the wafer carrier and rotating tubes can be formed from refractory metals, such as molybdenum, tungsten, and alloys thereof. Each of these materials, with or without coating, will have different coefficients of thermal expansion (CTE). For example, the coefficient of thermal expansion (CTE) of SiC coated graphite, which is commonly used for the wafer carrier, is −5.6×10⁻⁶° C.⁻¹. The coefficient of thermal expansion of quartz, which is commonly used as the rotating tube, is −5.5×10⁻⁷° C.⁻¹. The coefficient of thermal expansion of CVD SiC is −4.5×10⁻⁶° C.⁻¹. Given these coefficients of thermal expansion, an initial gap between the wafer carrier and the rotating tube at room temperature of about 0.5 mm reduces to about 0.05 mm at 1100° C. A small gap at high operating temperatures is required to maintain the integrity of the quartz tube. Because of the changing gap width, known wafer carrier designs do not spin around the geometrical center of the wafer carrier as the temperature increases. This leads to a linear, or asymmetric, temperature distribution along the wafer carrier radius. Asymmetric temperature non-uniformities cause deposition uniformities which cannot be compensated by multi-zone heating systems. Consequently, known wafer carriers for CVD reactors suffer from non-uniform asymmetric temperature profiles which result from the wafer carrier not rotating around its geometrical center.

Figure 2B:
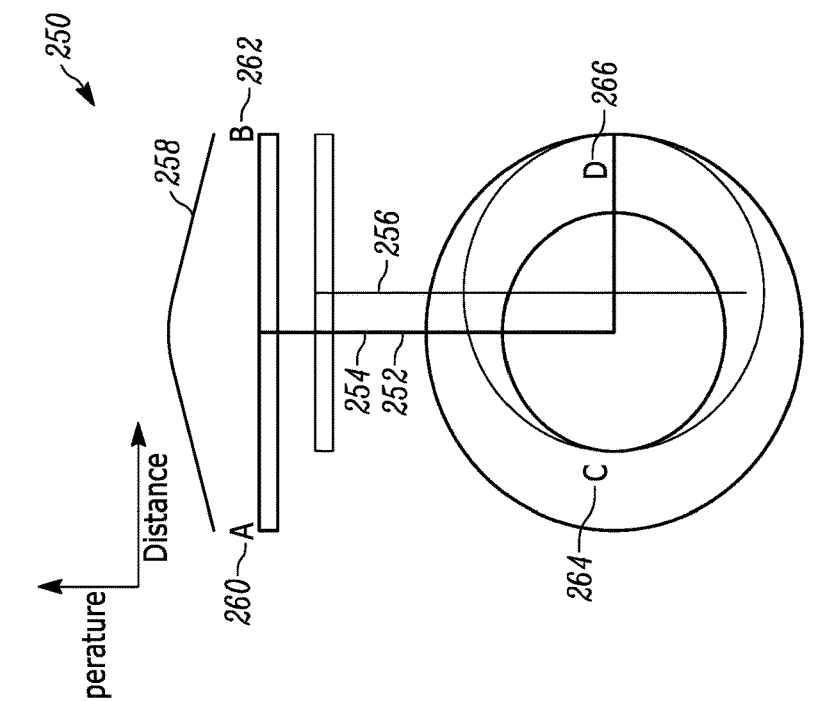
FIG. 2B illustrates a diagram of an embodiment of a CVD reactor of the present teaching with self-centering.
Figure 2A:
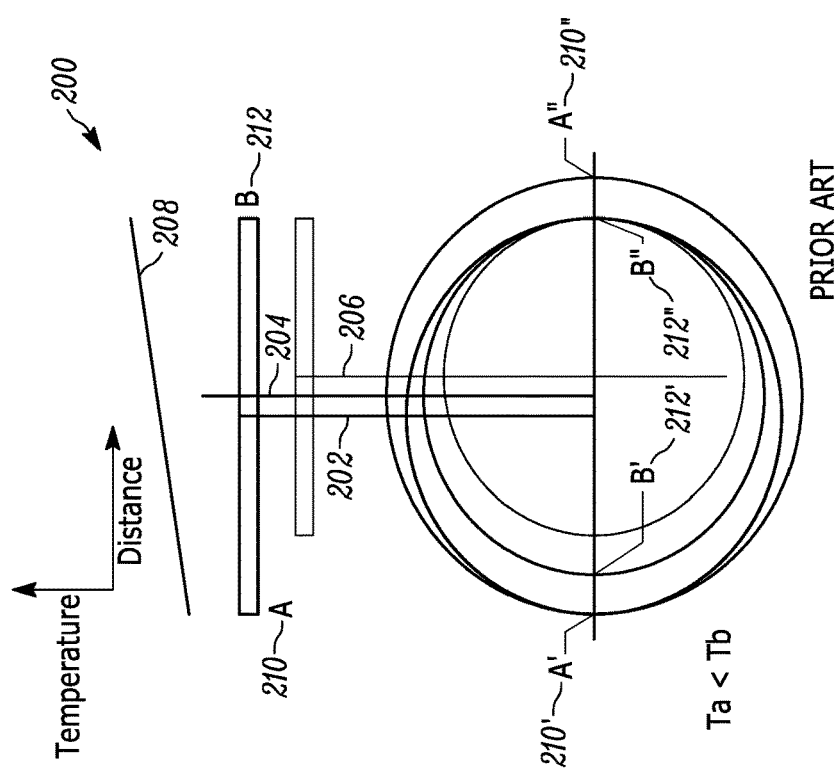
FIG. 2A illustrates a diagram of a CVD reactor that does not use a self-centering technique.

FIG. 2A illustrates a diagram of a CVD reactor that does not use a self-centering technique. FIG. 2A illustrates both a side-view and a plan-view of the relative positions of a wafer carrier, rotation axis, and heater for a CVD reactor 200 for a configuration where the wafer carrier center axis 202 is not coincident with the rotation axis 204 of the rotating tube. For purposes of this disclosure, a wafer carrier center axis, which is also sometimes referred to as a central axis, is defined herein as a line centered at the mid-point of the carrier, and extending in a direction normal to the top of the wafer carrier. In this configuration, the wafer carrier center axis 202 is offset from the rotation axis 204 of the rotating tube (not shown) and both the wafer carrier center axis 202 and the rotation axis 204 of the rotating tube are offset from the heater center 206. Consequently, when the wafer carrier is rotated, the point A 210 and point B 212 travel in different concentric circular paths. More specifically, the point A 210 moves from one far edge of the rotation tube to another far edge as shown by the position of points A' 210' and A" 210". The point B 212, which is closer to the rotation axis 204 moves from a more inner point of the rotation tube to another more inner point as shown by the position of points B' 212' and B" 212". In this way, the two points A 210 and B 212 experience different average temperatures on rotation, which leads to an asymmetric temperature profile 208. The asymmetric temperature profile 208 shows a higher temperature on one edge of the wafer, coincident with point B 212 as compared to the temperature on the opposite edge of the wafer coincident with point A 210.

Thus, in the configuration illustrated in FIG. 2A, the average temperature of point A 210, $T_a$, is less than the average temperature of point B 212, $T_b$, which creates a tilted asymmetric temperature profile 208. The asymmetric temperature profile 208 shows a higher temperature on the edge at point B 212 of the wafer as compared to the temperature on the opposite edge of the wafer at point A 210. Thus, the resulting temperature profile is asymmetric with respect to the rotation axis. Even in configurations where the carrier axis is coincident with the heater axis, wafer motion eccentricity owing to an offset between the carrier axis and the rotation axis still leads to asymmetric temperature non-uniformity.

FIG. 2B illustrates a diagram of an embodiment of a CVD reactor with self-centering according to the present teaching. FIG. 2B illustrates a side-view and plan-view of the relative positions of a wafer carrier, rotation axis, and heater for a CVD reactor 250 in the configuration where the wafer carrier center axis 252 is coincident with the rotation axis 254. Coincident alignment of the wafer carrier center axis and the rotation axis as described herein means that the two axes fall on the same line. The position of the wafer carrier center axis 252 relative to the rotation axis 254 of the rotating tube (not shown) is coincident, but offset from the heater center 256. When the wafer carrier center axis 252 and the rotation axis 254 are coincident, even if they are offset from the heater center, the wafer carrier is spinning around the rotation axis with no eccentricity. This configuration leads to a symmetrical temperature profile 258.

More specifically, in this configuration, when the carrier is rotated, the point A 260 and the point B 262 experience the same average temperature from the heater. Similarly, the point C 264 and the point D 266 also experience the same average temperature. However, the average temperature at points C 264 and D 266 are different from the average temperature of points A 260 and B 262. The resulting temperature profile 258 is axially symmetric, but non-uniform.

The uniformity of a film deposited with an axially symmetric non-uniform temperature profile 258 resulting from a self-centering wafer carrier of the present teaching can be improved by properly configuring and operating a multi-zone heater positioned proximate to the wafer carrier. Alternatively or in combination with proper use of a multi-zone heater positioned proximate to the wafer carrier, the film uniformity resulting from axially symmetric non-uniform temperature profile 258 of the present teaching can be improved by carrier pocket profiling for wafer temperature uniformity. See, for example, U.S. Pat. No. 8,486,726, entitled "Method for Improving Performance of a Substrate Carrier", which is assigned to the present assignee. The entire specification of U.S. Pat. No. 8,486,726 is incorporated herein by reference. Thus, an axially symmetric non-uniform temperature profile is more desirable than a non-symmetric profile, since known methods and apparatus for thermal management can be used to improve thermal uniformity and the resulting film deposition uniformity.

Figure 3A:
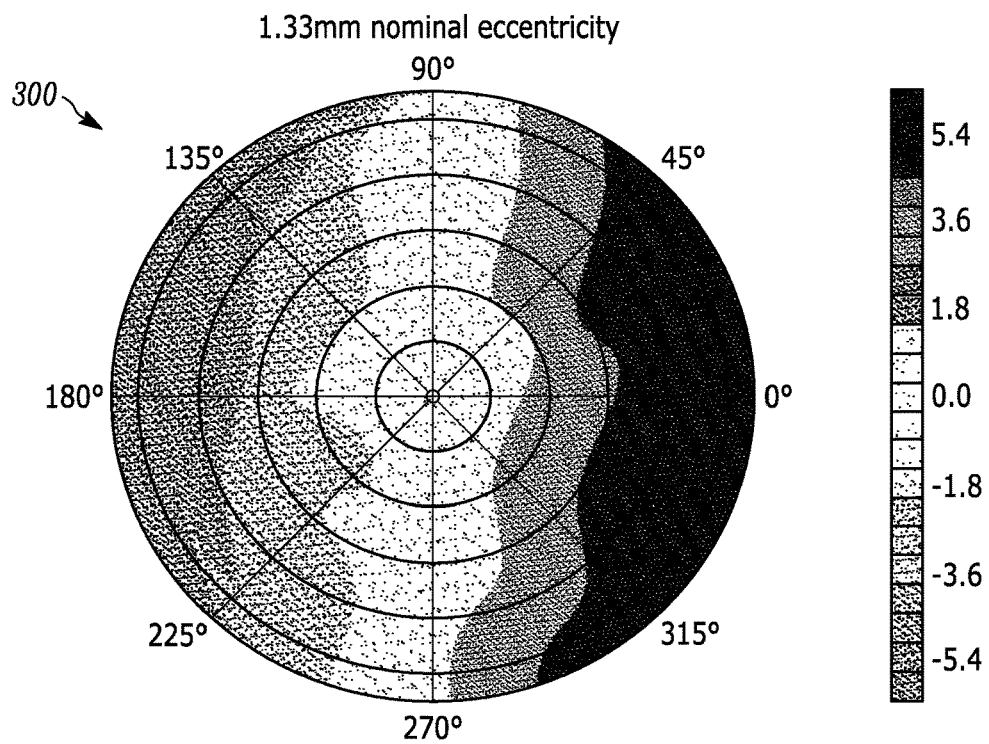
FIG. 3A illustrates a thermal profile across a circular wafer resulting from rotation eccentricity in a CVD reactor for a 1.33 mm induced eccentricity.
Figure 3B:
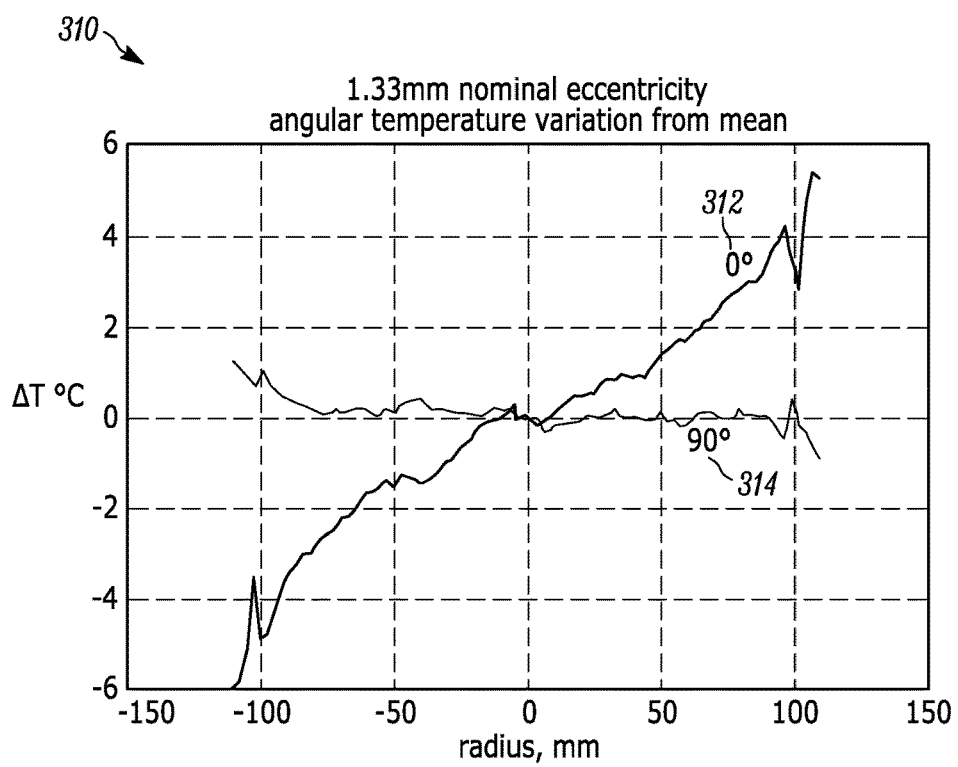
FIG. 3B illustrates the temperature gradient of the data from FIG. 3A as a function of radius.

FIG. 3A illustrates a thermal profile 300 across the surface of a circular wafer resulting from rotation eccentricity in a CVD reactor for a 1.33 mm induced eccentricity. FIG. 3B illustrates the temperature gradient as a function of radius 310 at 0° 312 and 90° 314 for the same 1.33 mm induced eccentricity as shown in FIG. 3A. FIG. 3B illustrates a large linear temperature distribution along the radius of the carrier. Such a linear temperature distribution cannot be easily compensated for because known multi-zone heating system alone will not compensate for linear temperature distributions. The linear temperature distribution results in low deposition uniformity.

Figure 3C:
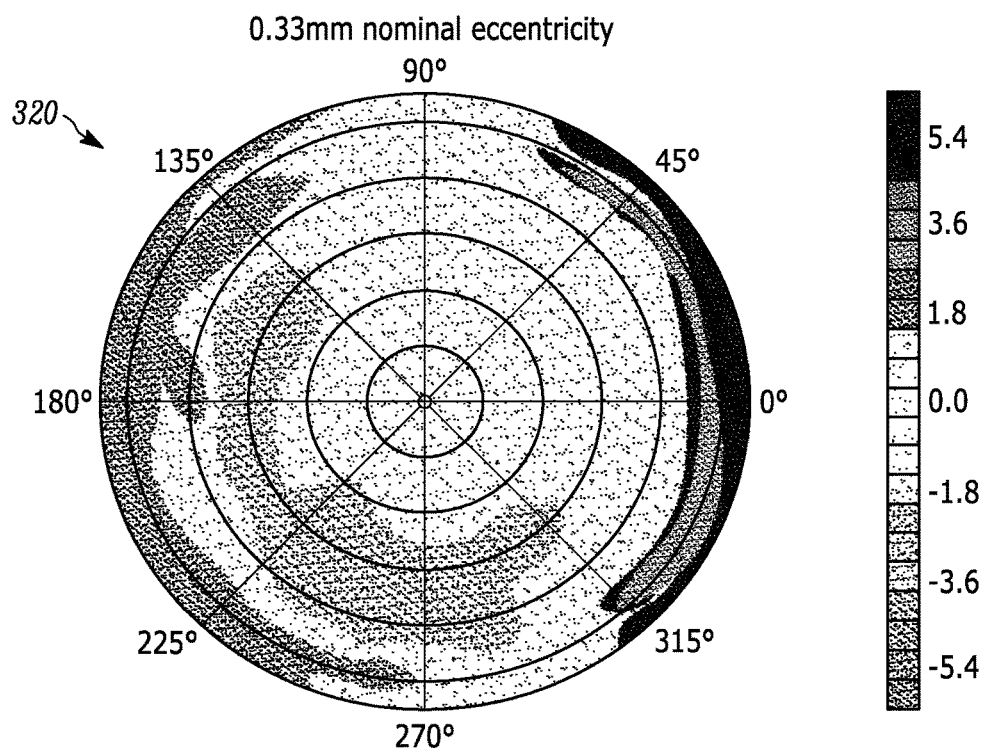
FIG. 3C illustrates a thermal profile across a circular wafer resulting from rotation eccentricity in a CVD reactor for a 0.33 mm induced eccentricity.
Figure 3D:
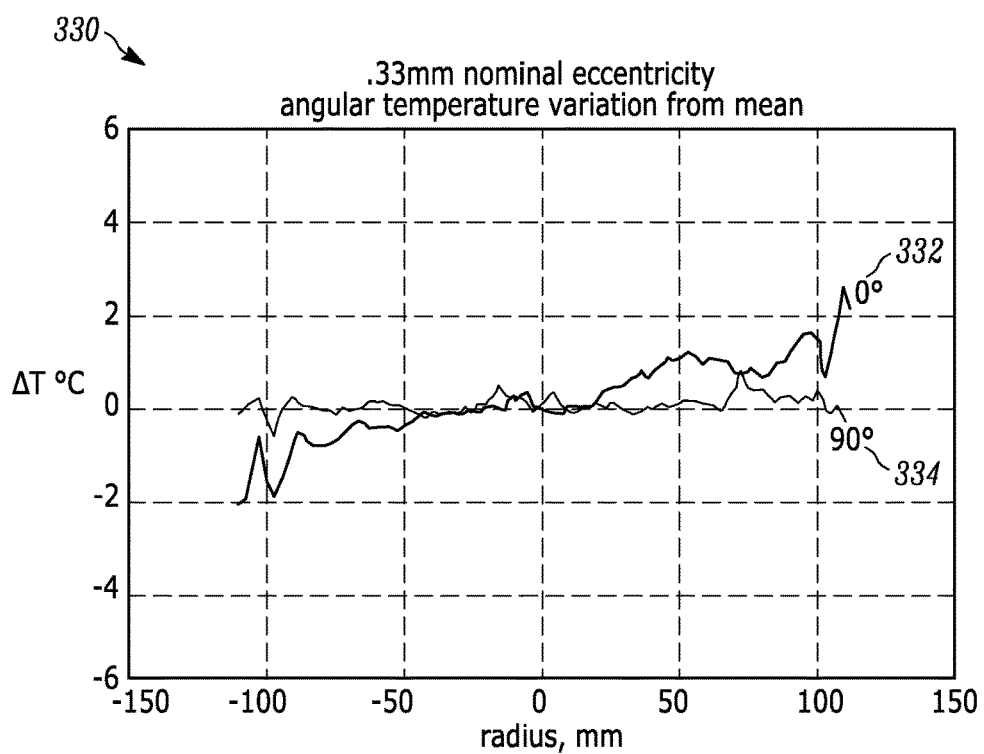
FIG. 3D illustrates the temperature gradient of the data from FIG. 3C as a function of radius.
Figure 3E:
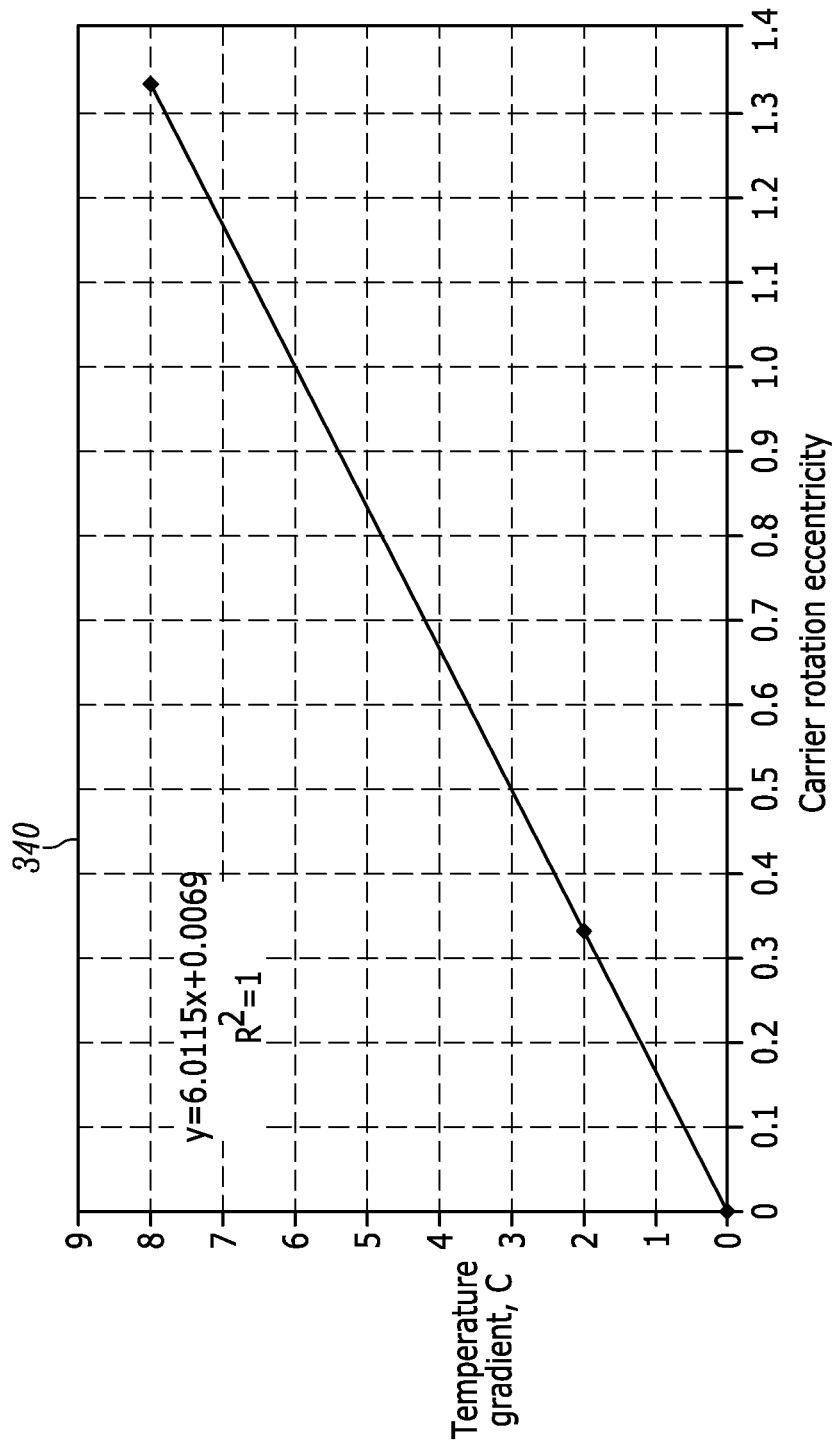
FIG. 3E illustrates a plot of the temperature gradient as a function of carrier rotation eccentricity.

FIG. 3C illustrates a thermal profile 320 across a circular wafer resulting from rotation eccentricity in a CVD reactor for a 0.33 mm induced eccentricity. FIG. 3D illustrates the temperature gradient as a function of radius 330 at 0° 332 and 90° 334 for the same 0.33 mm induced eccentricity. FIG. 3E illustrates a resulting plot of a temperature gradient 340 as a function of carrier rotation eccentricity based on the data from FIGS. 3A-D. The plot indicates that the gradient 340 is reduced to less than approximately 2° C. when carrier rotation eccentricity is less than 0.33 mm.

Thus, one feature of the present teaching is that a wafer carrier according to the present teaching can provide coincidence of the wafer carrier central axis and the rotation axis of the rotating tube at process temperature. This coincidence reduces eccentricity of the circular rotation of the wafer, in order to create an axially symmetric temperature profile that can be compensated for by properly using multi-zone heating elements.

Figure 4A:
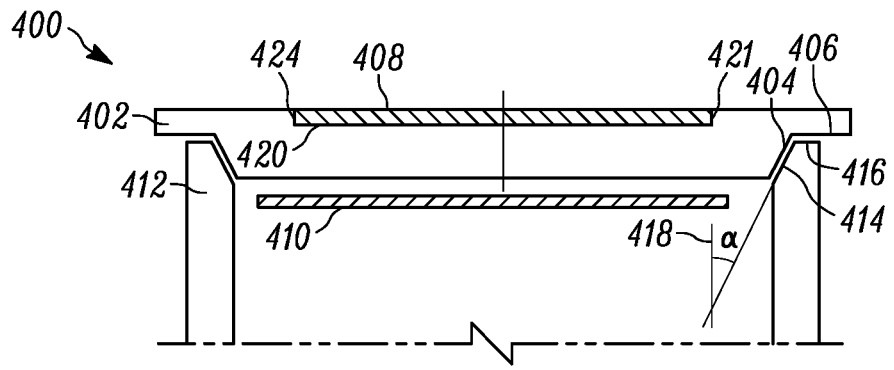
FIG. 4A illustrates a self-centering wafer carrier CVD system of the present teaching with a wafer carrier that has a beveled edge and a rim.

FIG. 4A illustrates a self-centering wafer carrier CVD system of the present teaching 400 with a wafer carrier 402 that has an edge 404 with a bevel geometry and a flat rim 406. The edge 404 of the wafer carrier 402 corresponds to a circular region at or near the outer perimeter of the wafer carrier. The edge protrudes from the lower surface of the wafer carrier. A wafer 408 is centered on the upper surface of the wafer carrier 402. A heating element 410 is located under the wafer carrier 402. The wafer 408, positioned in pocket 420, rim 406, and heating element 410 are all positioned in parallel. The edge of wafer 408 contacts sidewall 424 of pocket 420 at contact interface 421, which is discussed further below. The wafer carrier 402 is positioned on a rotating tube 412. The rotating tube 412 has an edge 414 with a beveled geometry and a flat rim 416. The wafer carrier edge 404 and the rotating tube edge 414 are proximate and parallel when the wafer carrier 402 is positioned on the rotating tube 412. In some embodiments, the bevel geometry on the edge 414 of the rotating tube 412 is formed at an angle α 418 with respect to the rotation axis of the rotating tube 412. Similarly, the bevel geometry on the edge 404 of the wafer carrier 402 is set at an angle α 418 with respect to the center-axis of the carrier that runs normal to the upper surface of the wafer carrier that supports the wafer. In some embodiments, the angle α 418 is chosen such that $\tan(\alpha) > f$, where f is the coefficient of friction between the wafer carrier and rotation tube materials.

Figure 4B:
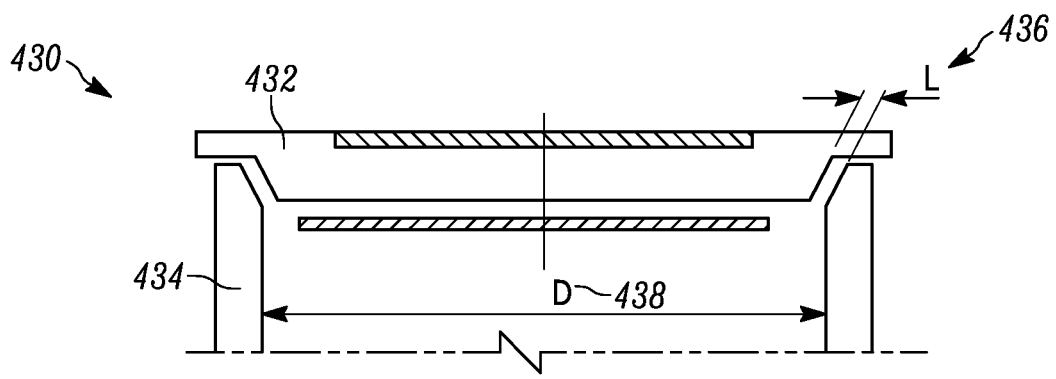
FIG. 4B illustrates a self-centering wafer carrier CVD system of the present teaching where the wafer carrier has been transferred into the process reactor (not shown) and positioned on the rotating tube at room temperature before the deposition process begins.

FIG. 4B illustrates a self-centering wafer carrier CVD system of the present teaching 430 where the wafer carrier 432 has been transferred into the process reactor (not shown) and positioned on the rotating tube 434 at room temperature before the deposition process begins. FIG. 4B illustrates a gap 436, with width L, and the rotating tube diameter 438, of width D. One feature of the wafer carrier of the present teaching is that the wafer carrier edge is dimensioned such that there is a gap between the edge of the rotating tube and the edge of the wafer carrier at room temperature. In some embodiments, the dimensions of the wafer carrier 432 and the rotating tube 434 are selected such that the gap 436 satisfies the following equation:

$$L < (CTE_{carrier} - CTE_{tube}) * D * T,$$

where $CTE_{carrier}$ is the coefficient of thermal expansion of the carrier 432, and $CTE_{tube}$ is the coefficient of thermal expansion of the rotating tube 434, and T is the process temperature. The gap 436 according to the above equation will decrease with increasing operating temperature, and just before the process temperature is realized, the gap will be substantially zero.

Figure 4C:
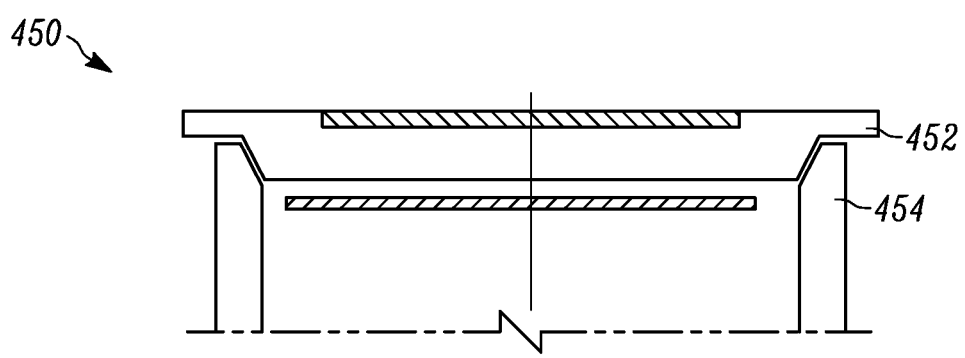
FIG. 4C illustrates a self-centering wafer carrier CVD system of the present teaching in the configuration described in connection with FIG. 4B but at process temperature.

FIG. 4C illustrates a self-centering wafer carrier CVD system of the present teaching 450 in the configuration described in connection with FIG. 4B, but at process temperature. The near contact between the beveled edges of the wafer carrier 452 and the rotating tube 454 result in a centering of the carrier on the rotating tube. Consequently, the wafer carrier center axis and the axis of rotation are coincident.

Figure 5A:
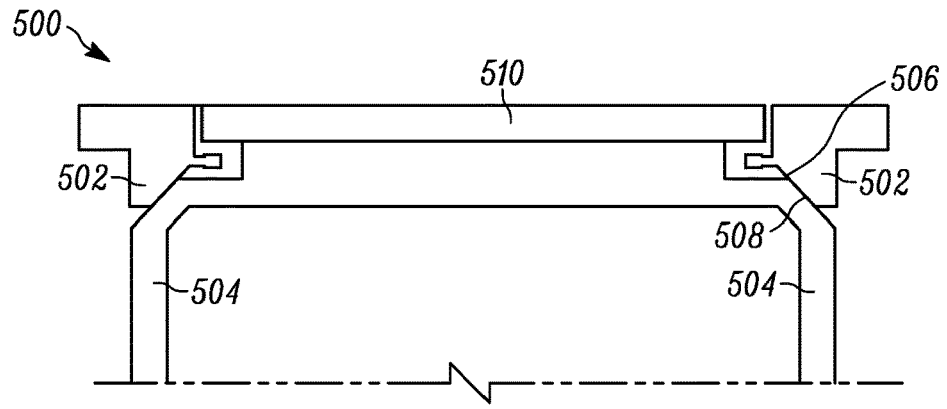
FIGS. 5 A-C illustrate various configurations of the wafer carrier and the rotating tube according to the present teaching that includes a beveled interface which provides self-centering of the wafer carrier to the rotation axis of the rotating tube.
Figure 5B:
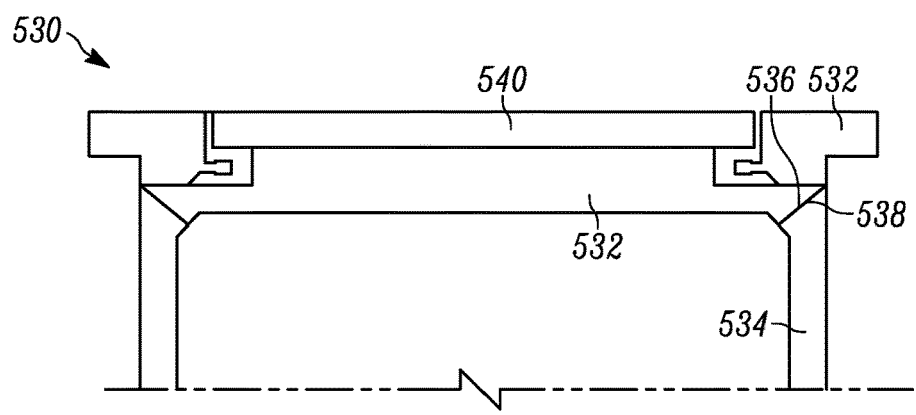
Figure 5C:
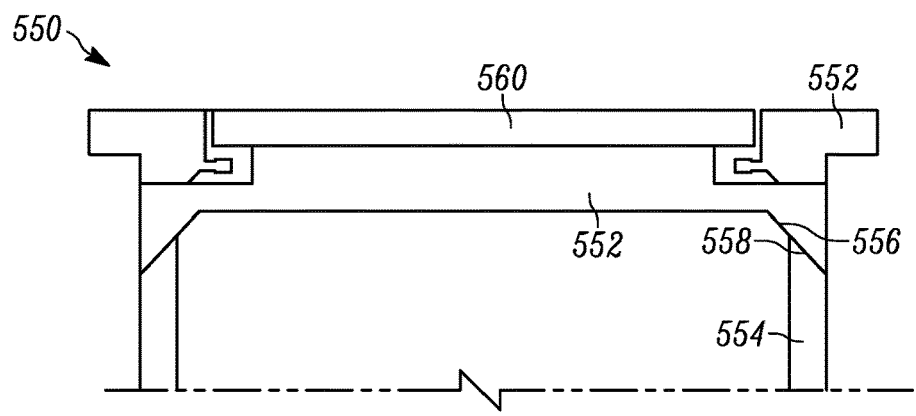

One skilled in the art will appreciate that numerous beveled geometries can be used to form the interface between the rotating tube and the wafer carrier. FIGS. 5A-C illustrate various configurations of the wafer carrier and the rotating tube according to the present teaching that includes various beveled geometry edges of the wafer carrier and the rotating tube and resulting interface between the wafer carrier and rotating tube which provides self-centering of the wafer carrier central axis and the rotation axis of the rotating tube.

FIG. 5A illustrates a first configuration 500 of the wafer carrier 502 including a first edge 506 that is positioned on the wafer carrier 502 proximate to the outer perimeter of the wafer carrier 502. The edge 506 of the wafer carrier 502 is formed with a beveled geometry and runs circularly around the center of the wafer carrier 502. An edge 508 is positioned on the rotating tube 504 proximate to the outer edge of the rotating tube 504. The edge 508 of the rotating tube 504 is formed with a beveled geometry and runs circularly around the perimeter of the rotating tube 504. The beveled geometry of the edge 506 of the wafer carrier 502 and the beveled geometry of the edge 508 of the rotating tube 504 are proximate and parallel when the wafer carrier 502 is positioned on the rotating tube 504. In the embodiment shown in FIG. 5A, the beveled edge is formed on the outer perimeter of the rotating tube 504. In other embodiments, the beveled edge of the rotating tube 504 is formed on the inner perimeter of the rotating tube 504. In the embodiment shown in FIG. 5A, during operation, the wafer carrier 502 is positioned on the rotating tube 504 such that the beveled geometry of the edge 506 of the wafer carrier 502 and the beveled geometry of the edge 508 of the rotating tube 504 are in near contact, thereby creating self-centering of the wafer 510 during processing because the beveled edges 506, 508 keep the axis of rotation of the rotating tube 504 coincident with the wafer carrier center.

FIG. 5B illustrates a second configuration 530 of the wafer carrier 532 and rotating tube 534 that includes an edge 536 with a beveled geometry that is positioned on the wafer carrier 532 and an edge 538 with a beveled geometry that is positioned on the rotating tube 534. The beveled edge 536 formed on the wafer carrier 532 and the beveled edge 538 formed on the rotating tube 534 are angled up and away from the inner perimeter of the rotating tube 534. The two beveled edges are parallel. During operation, the wafer carrier 532 is positioned on the rotating tube 534 such that the first beveled edge 536 and the second beveled edge 538 are in near contact, such that the wafer 540 is centered over the rotation axis during processing. The beveled edges 536, 538 keep the axis of rotation of the rotating tube 534 coincident with the wafer carrier center axis.

FIG. 5C illustrates a third configuration 550 of the wafer carrier 552 and rotating tube 554 that includes a first beveled edge 556 that is positioned on the wafer carrier 552 and a second beveled edge 558 positioned on the rotating tube 554. The first beveled edge 556 and the second beveled edge 558 are angled down and away from the inner perimeter of the rotating tube. The two beveled edges are parallel. During operation, the wafer carrier 552 is positioned on the rotating tube 554 such that the first beveled edge 556 and the second beveled edge 558 are in near contact, creating self-centering of the wafer 560 during processing. The beveled edges 556, 558 keep the axis of rotation of the rotating tube 554 coincident with the wafer carrier 552 center axis.

One feature of the present teaching is that the geometry of the edge of the wafer carrier and the geometry of the edge of the rotating tube create a particular amount of eccentric or nearly eccentric rotation of the wafer during processing at process temperature. The amount of eccentric or nearly eccentric rotation of the wafer during processing is chosen to achieve a desired process temperature profile that results in a highly uniform film thickness profile.

Figure 6A:
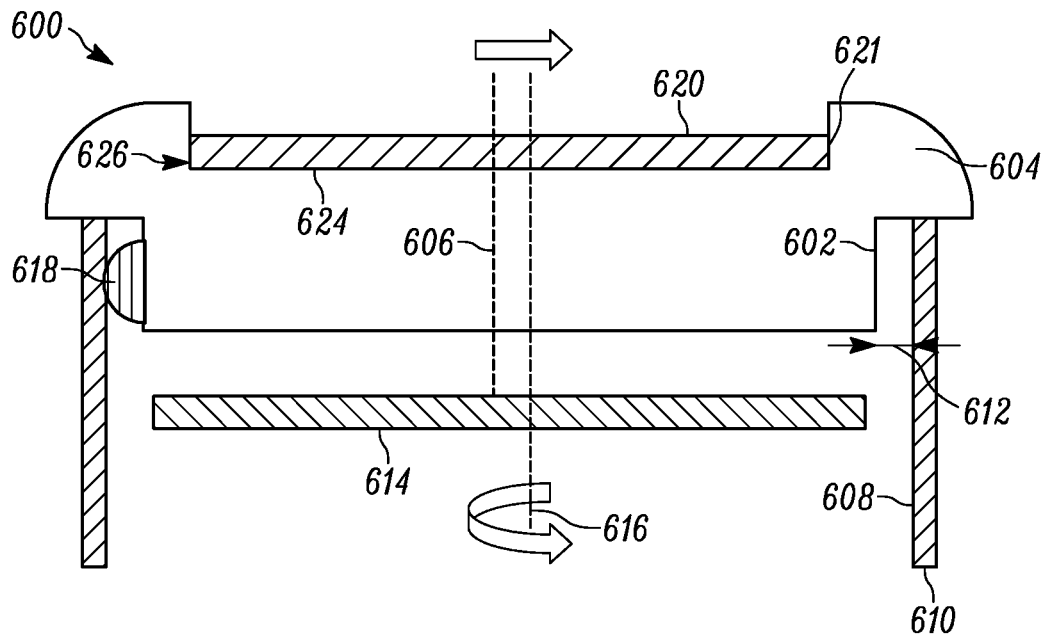
FIG. 6A illustrates a self-centering wafer carrier CVD system according to the present teaching at room temperature.

FIG. 6A illustrates a self-centering wafer carrier CVD system 600 according to the present teaching showing wafer 620 positioned in pocket 624 at room temperature. The edge of wafer 620 contacts sidewall 626 of pocket 624 at contact interface 621, which is discussed further below. The edge 602 of the wafer carrier 604 in this embodiment is parallel with the center axis 606 of the wafer carrier 604, and is also parallel with the edge 608 of the rotating tube 610. The geometry of the wafer carrier edge 602 is such that a gap 612 exists between the edge 602 of the wafer carrier 604 and the edge 608 of the rotating tube 610. The gap 612 allows enough room for expansion of the wafer carrier 604 relative to the rotating tube 610 so that no contact occurs between the wafer carrier edge 602 and the rotating tube edge 608. The wafer carrier 604 remains smaller than the rotating tube 610 throughout the entire process temperature cycle, and in particular at the highest process temperature. In some embodiments, a heater 614 is centered along the axis of rotation 616 of the rotating tube 610.

FIG. 6A shows that the center axis 606 of the wafer carrier 604 is not coincident with the axis of rotation 616. A spacer 618 is dimensioned such that at a process temperature, the wafer carrier center axis and the axis of rotation of rotating tube 610 are coincident. In some embodiments, the spacer 618 is machined into the wafer carrier edge 602 making it integral with its structure. In some embodiments, the wafer carrier 604 is graphite, and the spacer 618 is machined directly into the graphite and the entire wafer carrier 604 is then coated with a different material, such as silicon carbide (SiC). In some embodiments, two or more spacers are used to form a stable contact with the edge 608 of the rotating tube 610.

Figure 6B:
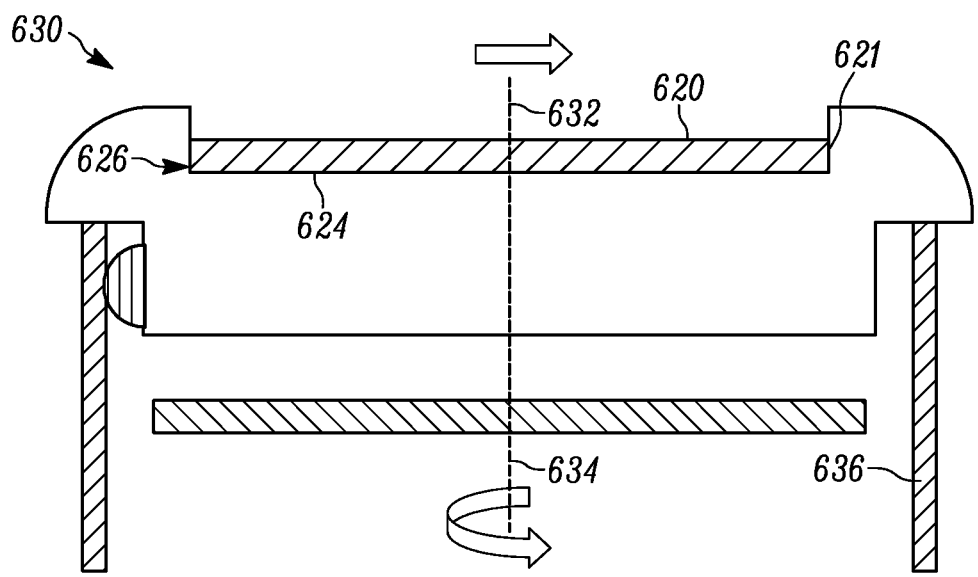
FIG. 6B illustrates a self-centering wafer carrier CVD system according to the present teaching at process temperature.

FIG. 6B illustrates a self-centering wafer carrier CVD system 630 according to the present teaching showing wafer 620 positioned in pocket 624 at process temperature. The edge of wafer 620 contacts sidewall 626 of pocket 624 at contact interface 621, which is discussed further below. FIG. 6B shows that the center of the wafer carrier 632 is aligned directly with the center of the axis of rotation 634 of the rotating tube 636 when the wafer carrier 632 is at the operating conditions. Thus, there is no eccentric rotation of the wafer during processing at process temperature.

Figure 6C:
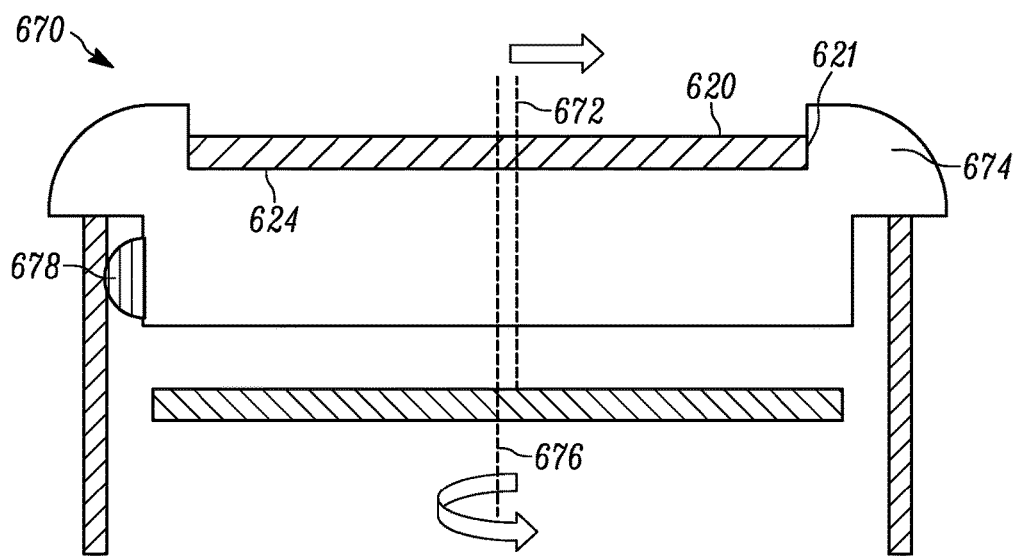
FIG. 6C illustrates a self-centering wafer carrier CVD system according to the present teaching at a temperature that is higher than process temperature.

FIG. 6C illustrates a self-centering wafer carrier CVD system 670 according to the present teaching showing wafer 620 positioned in pocket 624 at a temperature that is higher than the process temperature. The edge of wafer 620 contacts the sidewall of pocket 624 at contact interface 621, which is discussed further below. FIG. 6C shows that at temperatures higher than the process temperature, the center axis 672 of the wafer carrier 674 is no longer aligned with the axis of rotation 676. In some embodiments, the spacer 678 is used to offset the eccentricity caused by the offset between the center of the wafer carrier 672 and the axis of rotation 676 to provide a symmetric temperature profile at these higher process temperatures.

Figure 7:
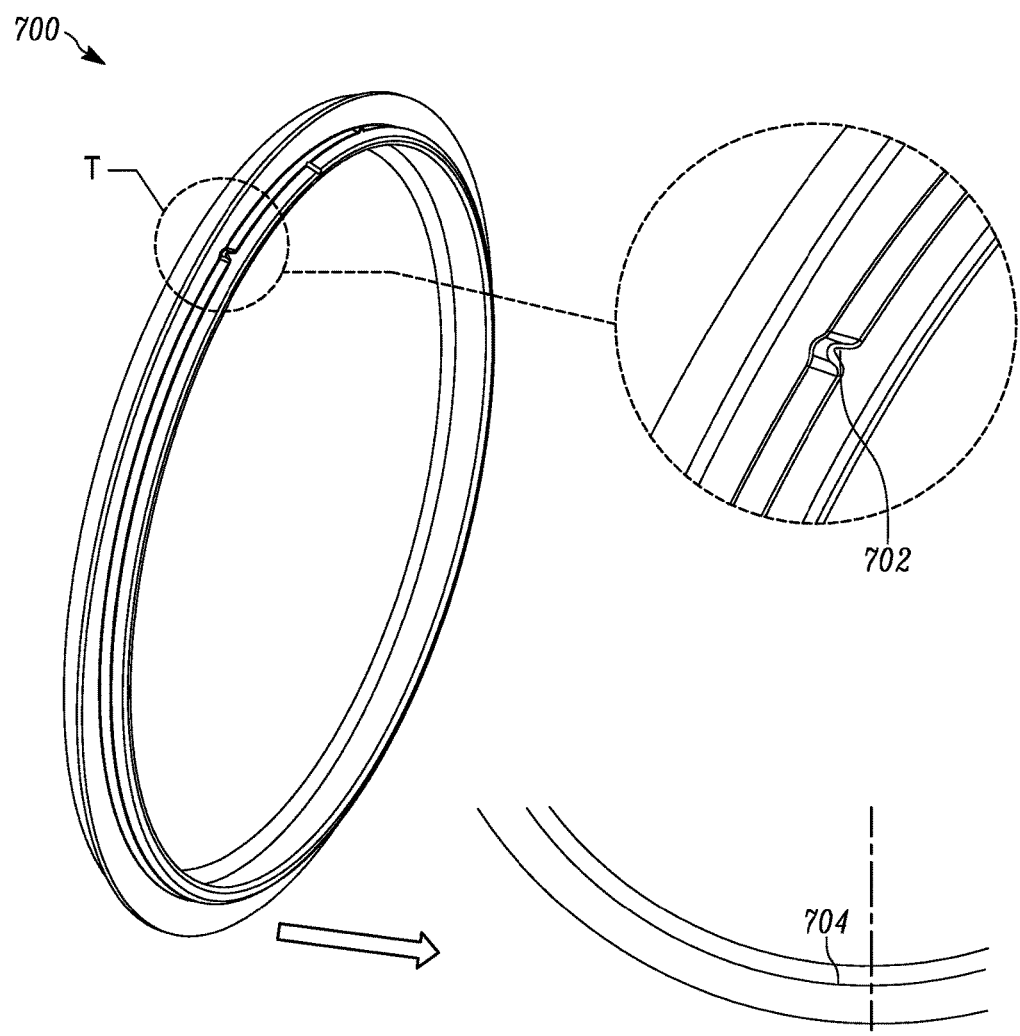
FIG. 7 illustrates a self-centering wafer carrier of the present teaching comprising spacers and relief structure.

FIG. 7 illustrates a self-centering wafer carrier 700 of the present teaching with an edge geometry that includes one or more spacers 702 positioned on the circular region that corresponds to the edge of the wafer carrier, and a relief structure 704 positioned opposite to the one or more spacers 702. In the embodiment shown in FIG. 7, the relief structure 704 includes one or more flat sections that are diametrically opposed to spacers 702. The relief structure 704 shifts the center of mass of the wafer carrier 700.

During rotation, the centrifugal force of the rotating mass helps to overcome the friction between the edge of the wafer carrier 700, and the edge of the rotating tube (not shown in FIG. 7). The centrifugal force moves the wafer carrier 700 in a direction such that the one or more spacers 702 remain in contact with the edge of the rotating tube.

One feature of the self-centering wafer carrier of the present teaching is that both sides of the wafer can be open and free from contact with a substantial amount of wafer carrier surface. FIGS. 8A-C illustrate embodiments of a self-centering wafer carrier CVD system 800 of the present teaching with an open-carrier design. By "open carrier design" we mean that portions of the wafer 802 are open or unsupported. Only a small region around the perimeter of the wafer is in physical contact with the wafer carrier. In some embodiments, a separator plate is used to define the region inside the rotating tube to which the backside of the wafer is exposed.

FIG. 8A illustrates an open-carrier design with a separator plate 806. In the embodiment of the open-carrier design shown in FIG. 8A, the wafer 802 is supported by the wafer carrier 804 at the perimeter of the wafer 802, leaving both the top and the bottom of the wafer 802 exposed to the atmosphere in the chamber above and below the wafer.

FIG. 8B illustrates an embodiment of a self-centering carrier CVD system 830 of the present teaching with a wafer carrier 832 that comprises an open-carrier design and a geometry with a beveled edge 834. The beveled edge 834 of the wafer carrier rests on a beveled edge 836 of the rotating tube 838 when the wafer carrier 832 is positioned on the rotating tube 838. The interface between the two beveled edges 834, 836 centers the wafer carrier 832 with respect to the rotation axis of the rotating tube 838.

FIG. 8C illustrates an embodiment of a self-centering wafer carrier CVD system 870 of the present teaching with a vertical, tangential lock 872 for the separator plate 874. The embodiment illustrated in FIG. 8C is designed for positive purge 876 in the cavity above the separator plate. The purge gases are provided to the region between the separator plate 874 and the wafer 878 by a tube 880 that passes through the separator plate 874. The bottom side of the wafer 878 is exposed to the purge gasses. Thus, in various embodiments, the open-carrier design wafer carriers utilize various geometries and dimensions of the wafer carrier edge and the rotating tube edge that provides self-centering of the wafer carrier to the rotation axis of the rotating tube.

Figure 8D:
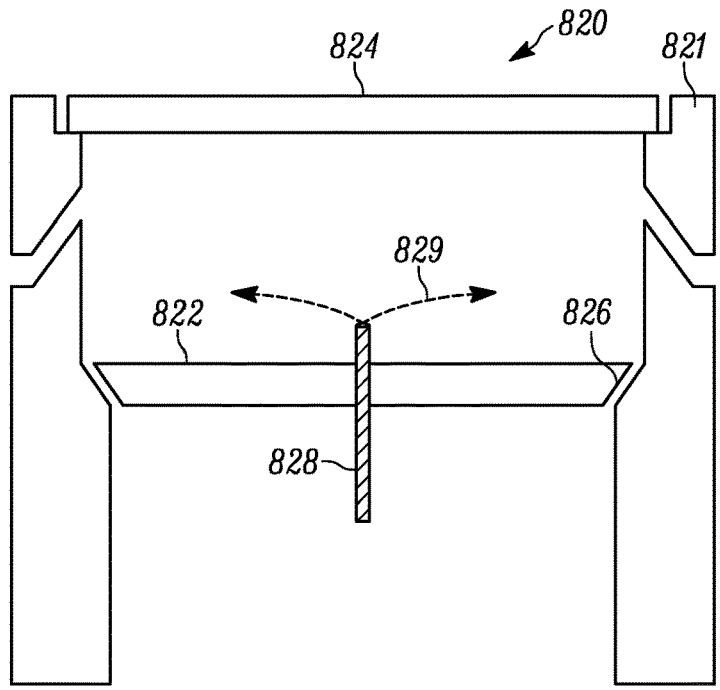
FIG. 8D illustrates an embodiment of a self-centering wafer carrier CVD system of the present teaching comprising an open-carrier with a simple separator.

FIG. 8D illustrates an embodiment of a self-centering wafer carrier CVD system 820 of the present teaching comprising an open-carrier 821 with a simple separator 822. The separator 822 prevents refractory metals, such as tungsten, from depositing on the backside of the wafer 824. The separator 822 provides radiant heating to the wafer 824. In various embodiments, the separator 822 is made from silicon carbide, quartz, or other material. Using silicon carbide provides relatively low temperature ramp rates because silicon carbide has a high thermal conductivity. The separator 822 may be formed from non-transparent material to minimize cleaning requirements. Also, the separator 822 can include a beveled edge 826 to provide self-centering. In some embodiments, both the wafer carrier 821 and the separator 822 utilize self-centering geometries and dimensions of the respective edges in order to prevent non-uniform temperature profiles during deposition. A purge tube 828 is used to provide positive pressure purge gas 829 to the cavity.

Figure 8E:
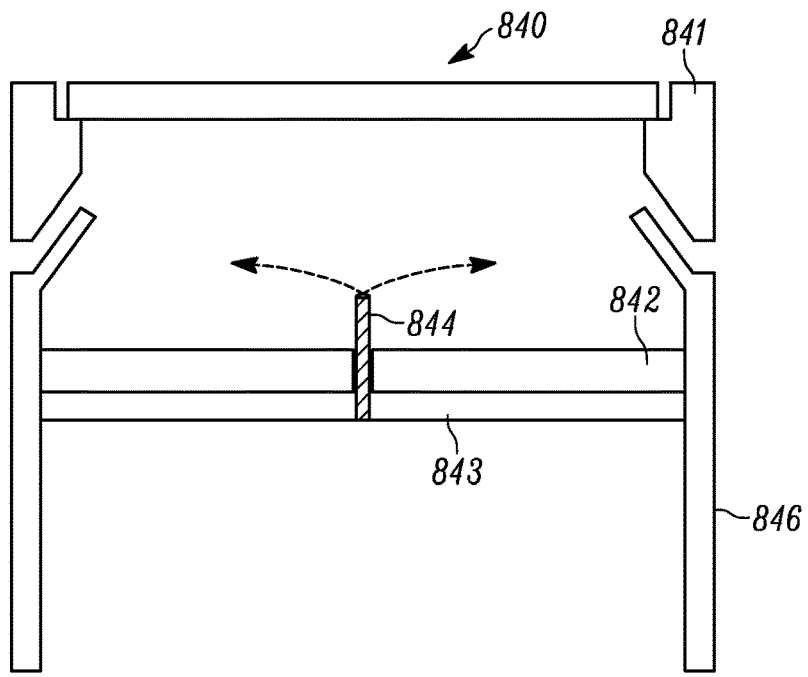
FIG. 8E illustrates an embodiment of a self-centering wafer carrier CVD system of the present teaching comprising an open-carrier with a centrally located separator.

FIG. 8E illustrates an embodiment of a self-centering wafer carrier CVD system of the present teaching comprising an open-carrier 841 with a centrally-located separator 842. The separator 842 is centered on a quartz buffer 843 using a brace 844 that also serves as a purge tube. The brace 844 provides self-centering of the separator 842 to the rotation axis of the rotating tube 846. The edge dimension and geometry of the wafer carrier 841 provides self-centering of the wafer carrier 841 to the rotation axis of the rotating tube 846. The separator 842 may be formed from non-transparent material to minimize cleaning requirements.

Figure 8F:
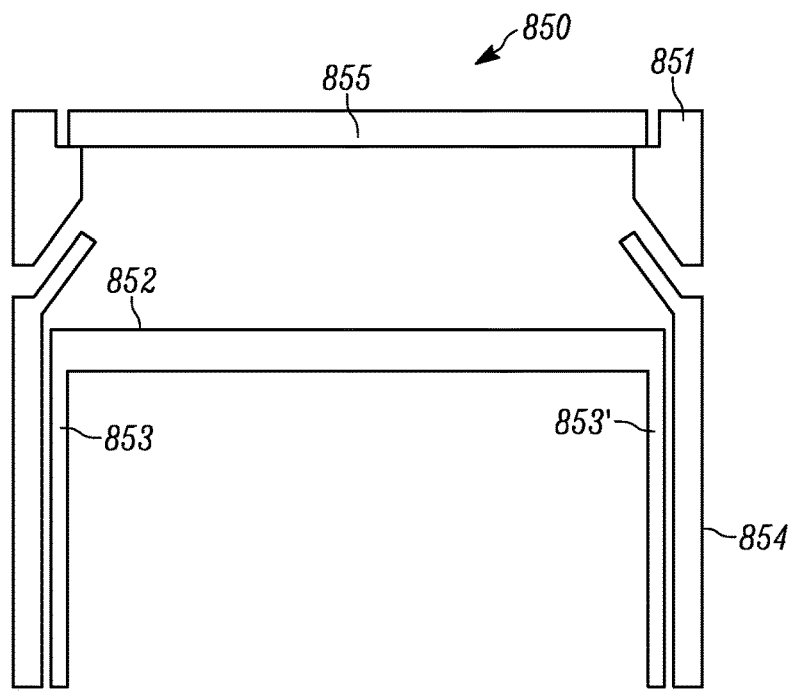
FIG. 8F illustrates an embodiment of a self-centering wafer carrier CVD system of the present teaching comprising an open-carrier with a static separator.

FIG. 8F illustrates an embodiment of a self-centering wafer carrier CVD system 850 of the present teaching comprising an open-carrier 851 with a static separator 852. The umbrella-shaped static separator 852 has two edges 853, 853' that cause the separator 852 to remain static with respect to the rotating tube 854 during rotation. In other words, the static separator 852 does not rotate with the rotating tube 854 during operation. In various embodiments, the dimension and geometry of the static separator 852 is chosen to minimize stresses that arise because of the temperature differences between the top and the bottom for the static separator 852. In various embodiments, the static separator 852 is made from silicon carbide, quartz, or other material. Using silicon carbide provides lower ramp rates because silicon carbide has a high thermal conductivity. The static separator 852 may be formed from non-transparent material to minimize cleaning requirements. The static separator 852 prevents refractory metals, such as tungsten, from depositing on the backside of the wafer 855.

Figure 8G:
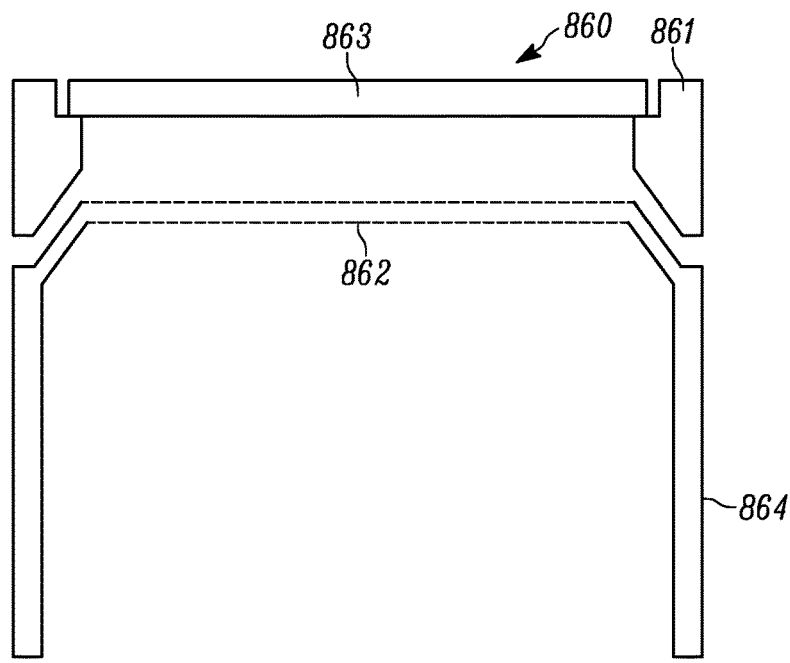
FIG. 8G illustrates an embodiment of a self-centering wafer carrier CVD system of the present teaching comprising an open-carrier with a removable quartz separator.

FIG. 8G illustrates an embodiment of a self-centering wafer carrier CVD system 860 of the present teaching comprising an open-carrier 861 and a quartz separator 862. The quartz separator 862 may be permanent or removable. The quartz separator 862 prevents refractory metals, such as tungsten, from depositing on the backside of the wafer 863. In the case of a permanent quartz separator, the separator 862 may be a continuous piece of quartz with the rotating tube 864. This continuous-piece design eliminates the issue of centering the separator, since the separator is part of the rotating structure. A non-transparent silicon carbide carrier 861 blocks stray light. In many embodiments, the dimensions and geometry of the separator 862 is chosen to avoid stresses due to thermal gradients.

Figure 8H:
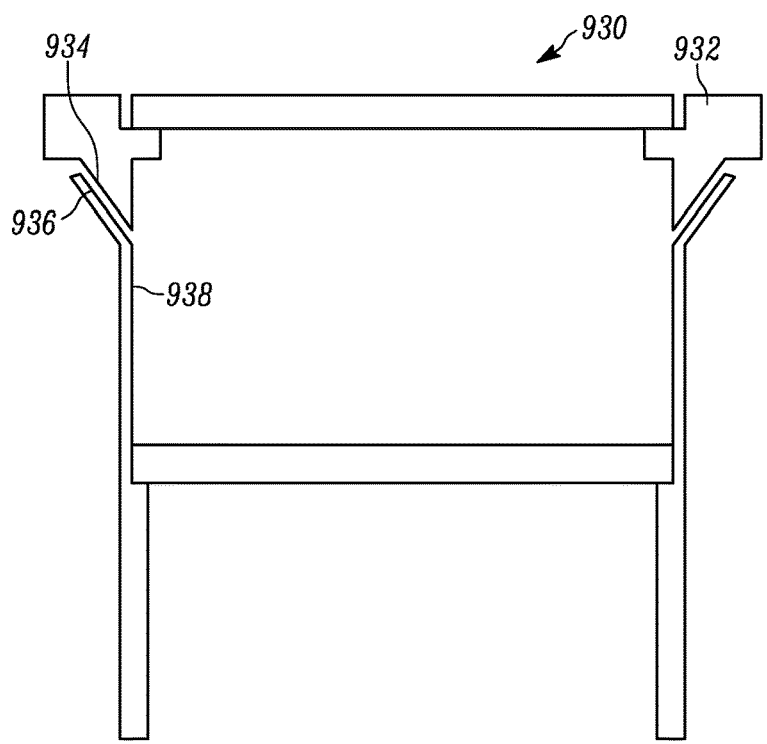
FIG. 8H illustrates another embodiment of a self-centering wafer carrier CVD system of the present teaching comprising an open-carrier design and a beveled edge.

FIG. 8H illustrates an embodiment of a self-centering carrier CVD system 930 of the present teaching with a wafer carrier 932 that comprises an open-carrier design and geometry with a beveled edge 934. The beveled edge 934 of the wafer carrier rests on a beveled edge 936 of the rotating tube 938 when the wafer carrier 932 is positioned on the rotating tube 938. The interface between the two beveled edges 934, 936 centers the wafer carrier 932 with respect to the rotation axis of the rotating tube 938.

Figure 8I:
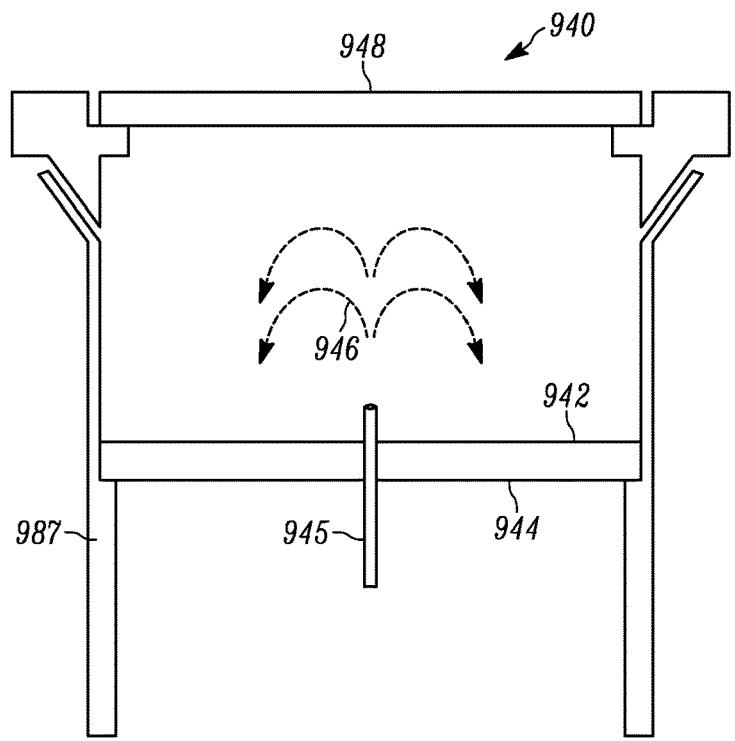
FIG. 8I illustrates another embodiment of a self-centering wafer carrier CVD system of the present teaching comprising an open-carrier and positive purge design.

FIG. 8I illustrates an embodiment of a self-centering wafer carrier CVD system 940 of the present teaching with a vertical, tangential lock 942 for the separator plate 944. The embodiment illustrated in FIG. 8I is designed for positive purge 946 in the cavity above the separator plate. The purge gases are provided to the region between the separator plate 944 and the wafer 948 by a tube 945 that passes through the separator plate 944. The bottom side of the wafer 948 is exposed to the purge gasses. Thus, in various embodiments, the open-carrier design wafer carriers utilize various geometries and dimensions of the wafer carrier edge and the rotating tube edge that provides self-centering of the wafer carrier to the rotation axis of the rotating tube 987.

Figure 8J:
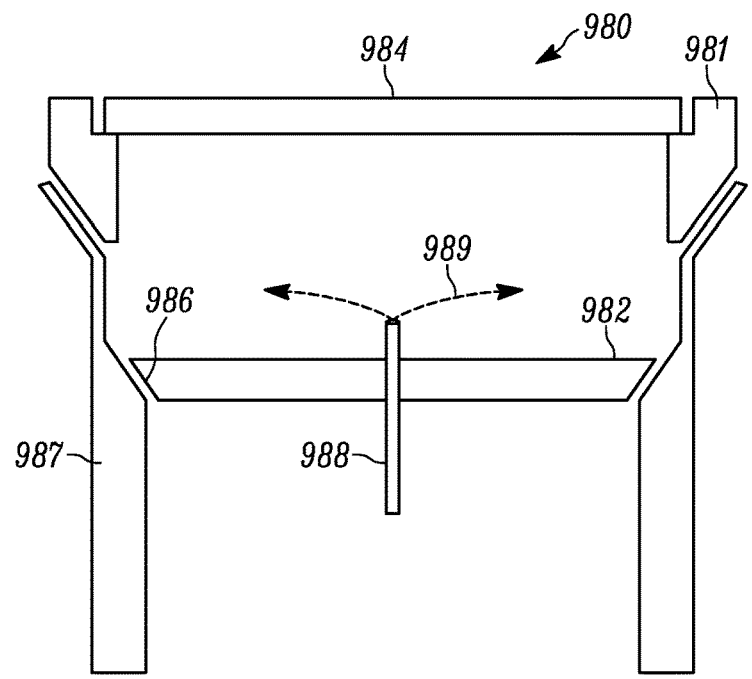
FIG. 8J illustrates another embodiment of a self-centering wafer carrier CVD system of the present teaching comprising an open-carrier with a simple separator.

FIG. 8J illustrates an embodiment of a self-centering wafer carrier CVD system 980 of the present teaching comprising an open-carrier 981 with a simple separator 982. The separator 982 prevents refractory metals, such as tungsten, from depositing on the backside of the wafer 984. The separator 982 provides radiant heating to the wafer 984. In various embodiments, the separator 982 is made from silicon carbide, quartz, or other material. Using silicon carbide provides a relatively high temperature ramp rates because silicon carbide has a high thermal conductivity. The separator 982 may be formed from non-transparent material to minimize cleaning requirements. Also, the separator 982 can include a beveled edge 986 to provide self-centering. In some embodiments, both the wafer carrier 981 and the separator 982 utilize self-centering geometries and dimensions of the respective edges in order to prevent non-uniform temperature profiles during deposition. A purge tube 988 is used to provide positive pressure purge gas 989 to the cavity.

Figure 8K:
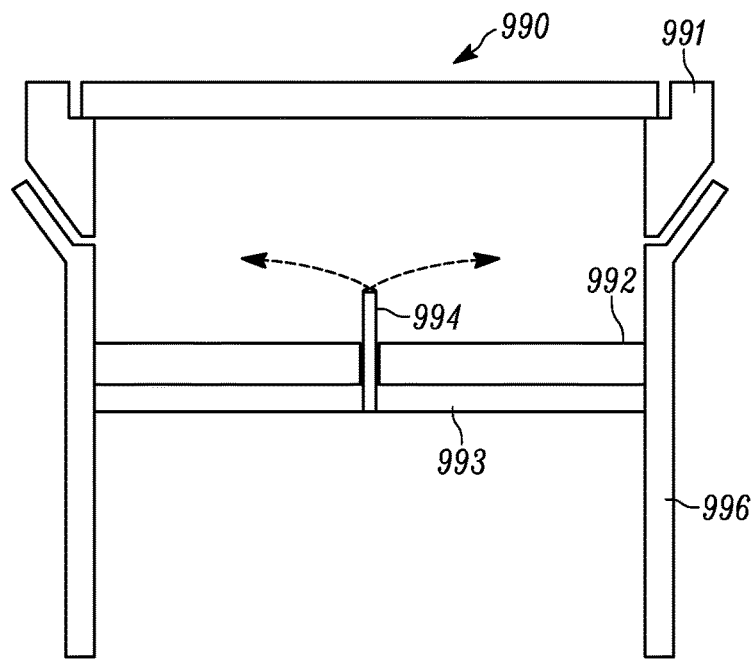
FIG. 8K illustrates another embodiment of a self-centering wafer carrier CVD system of the present teaching comprising an open-carrier with a centrally located separator.

FIG. 8K illustrates an embodiment of a self-centering wafer carrier CVD system 990 of the present teaching comprising an open-carrier 991 with a centrally-located separator 992. The separator 992 is centered on a quartz buffer 993 using a brace 994 that also serves as a purge tube. The brace 994 provides self-centering of the separator 992 to the rotation axis of the rotating tube 996. The edge dimension and geometry of the wafer carrier 991 provides self-centering of the wafer carrier 991 to the rotation axis of the rotating tube 996. The separator 992 may be formed from non-transparent material to minimize cleaning requirements.

Figure 8L:
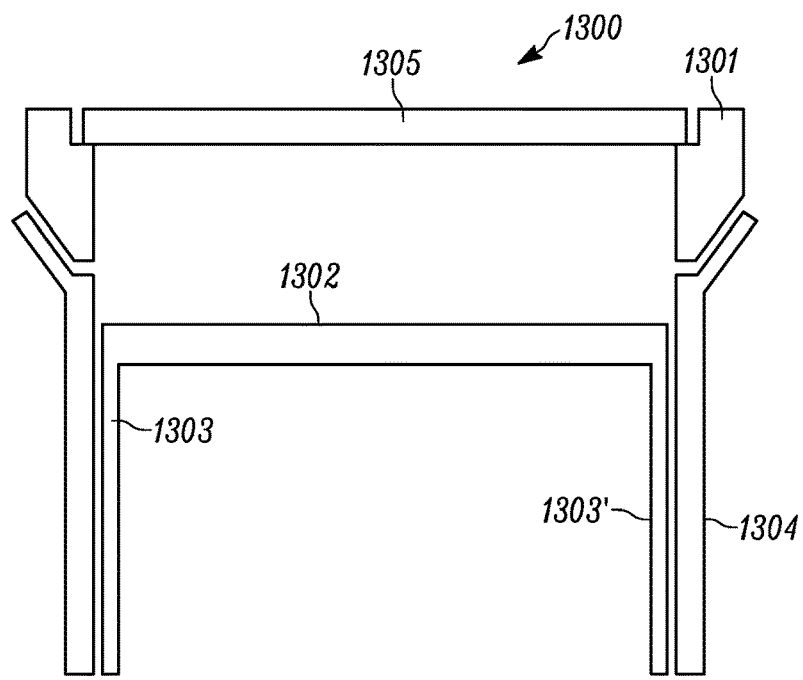
FIG. 8L illustrates another embodiment of a self-centering wafer carrier CVD system of the present teaching comprising an open-carrier with a static separator.

FIG. 8L illustrates an embodiment of a self-centering wafer carrier CVD system 1300 of the present teaching comprising an open-carrier 1301 with a static separator 1302. The umbrella-shaped static separator 1302 has two edges 1303, 1303' that cause the separator 1302 to remain static with respect to the rotating tube 1304 during rotation. In other words, the static separator 1302 does not rotate with the rotating tube 1304 during operation. In various embodiments, the dimension and geometry of the static separator 1302 is chosen to minimize stresses that arise because of the temperature differences between the top and the bottom for the static separator 1302. In various embodiments, the static separator 1302 is made from silicon carbide, quartz, or other material. Using silicon carbide provides a relatively high ramp rates because silicon carbide has a low thermal conductivity. The static separator 1302 may be formed from non-transparent material to minimize cleaning requirements. The static separator 1302 prevents refractory metals, such as tungsten, from depositing on the backside of the wafer 1305.

Figure 8M:
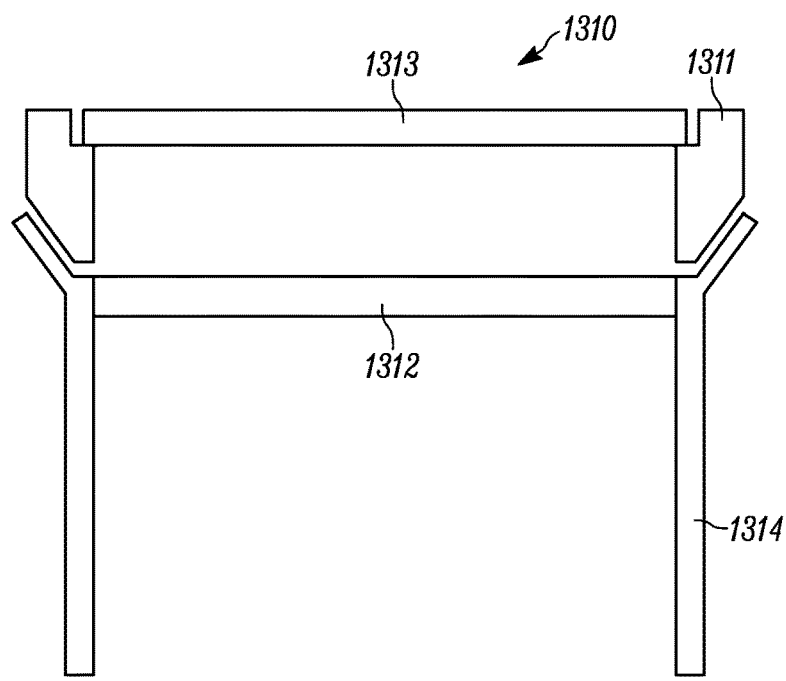
FIG. 8M illustrates another embodiment of a self-centering wafer carrier CVD system of the present teaching comprising an open-carrier with a removable quartz separator.

FIG. 8M illustrates an embodiment of a self-centering wafer carrier CVD system 1310 of the present teaching comprising an open-carrier 1311 and a quartz separator 1312. The quartz separator 1312 may be permanent or removable. The quartz separator 1312 prevents refractory metals, such as tungsten, from depositing on the backside of the wafer 1313. In the case of a permanent quartz separator, the separator 1312 may be a continuous piece of quartz with the rotating tube 1314. This continuous-piece design eliminates the issue of centering the separator, since the separator is part of the rotating structure. A non-transparent silicon carbide carrier 1311 blocks stray light. In many embodiments, the dimensions and geometry of the separator 1312 is chosen to avoid stresses due to thermal gradients.

Figure 9A:
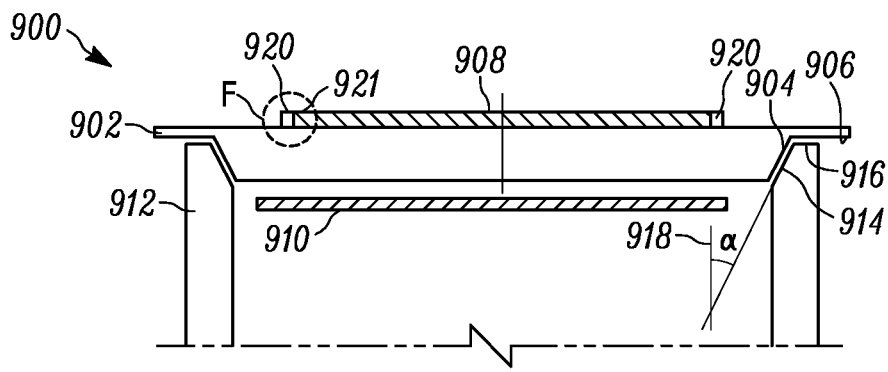
FIG. 9A illustrates a self-centering wafer carrier CVD system of the present teaching with a pocketless wafer carrier that has an edge with a bevel geometry and a rim.

FIG. 9A illustrates a self-centering pocketless wafer carrier CVD system 900 of the present teaching with a wafer carrier 902 that has an edge 904 with a bevel geometry and a flat rim 906. The edge 904 of the wafer carrier 902 corresponds to a circular region at or near the outer perimeter of the wafer carrier. The edge protrudes from the lower surface of the wafer carrier. A wafer 908 is centered on the upper surface of the wafer carrier 902 by post 920. The edge of wafer 908 and post 920 contact at contact interface 921, which is discussed further below. A heating element 910 is located under the wafer carrier 902. The wafer 908, rim 906, and heating element 910 are all positioned in parallel. The wafer carrier 902 is positioned on a rotating tube 912. The rotating tube 912 has an edge 914 with a beveled geometry and a flat rim 916. The wafer carrier edge 904 and the rotating tube edge 914 are proximate and parallel when the wafer carrier 902 is positioned on the rotating tube 912. In some embodiments, the bevel geometry on the edge 914 of the rotating tube 912 is formed at an angle α 918 with respect to the rotation axis of the rotating tube 912. Similarly, the bevel geometry on the edge 904 of the wafer carrier 902 is set at an angle α 918 with respect to the center-axis of the carrier that runs normal to the upper surface of the wafer carrier that supports the wafer. In some embodiments, the angle α 918 is chosen such that $\tan(\alpha) > f$, where $f$ is the coefficient of friction between the wafer carrier and rotation tube materials. The wafer carrier 902 does not have a pocket and can be considered to be a pocketless carrier where the posts 920 retain wafer 908 on wafer carrier 904 during operation.

Figure 9B:
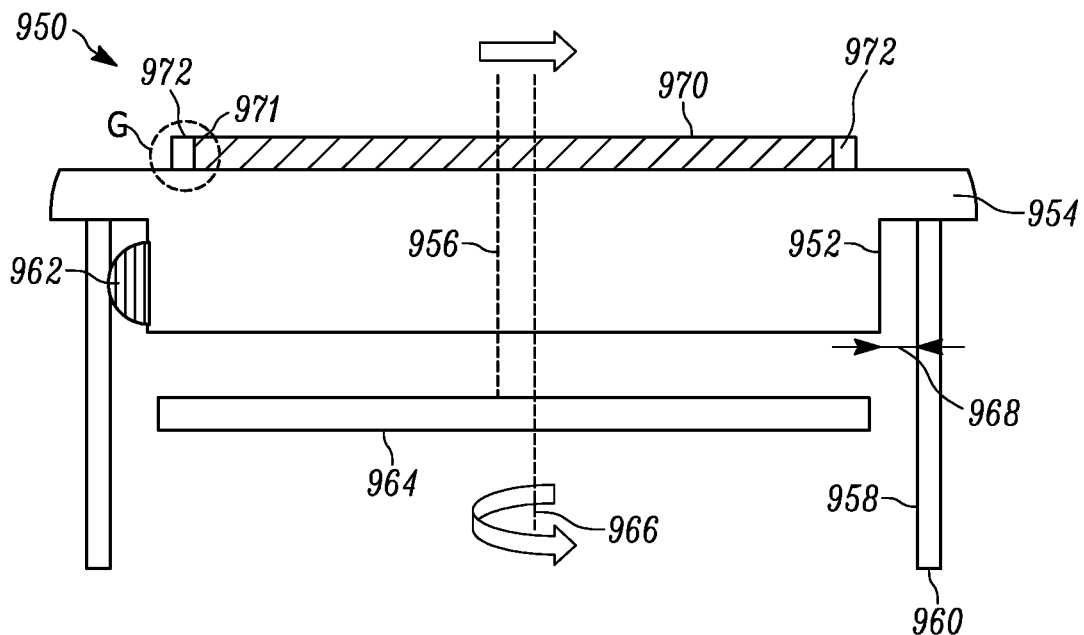
FIG. 9B illustrates a self-centering wafer carrier CVD system of a pocketless wafer carrier according to the present teaching at room temperature.

FIG. 9B illustrates a self-centering pocketless wafer carrier CVD system 950 according to the present teaching at room temperature. The edge 952 of the wafer carrier 954 in this embodiment is parallel with the center axis 956 of the wafer carrier 954, and is also parallel with the edge 958 of the rotating tube 960. The geometry of the wafer carrier edge 952 is such that a gap 968 exists between the edge 952 of the wafer carrier 954 and the edge 958 of the rotating tube 960. The gap 968 allows enough room for expansion of the wafer carrier 954 relative to the rotating tube 960 so that no contact occurs between the wafer carrier edge 952 and the rotating tube edge 958. The wafer carrier 954 remains smaller than the rotating tube 960 throughout the entire process temperature cycle, and in particular at the highest process temperature. In some embodiments, a heater 964 is centered along the axis of rotation 966 of the rotating tube 960.

FIG. 9B shows that the center axis 956 of the wafer carrier 954 is not coincident with the axis of rotation 966. A spacer 962 is dimensioned to make the rotation of the wafer carrier 954 eccentric where wafer 970 is within the circle that represents the rotating tube 960. Wafer 970 is centered on wafer carrier 954 by post 972. The edge of wafer 970 and post 972 contact at contact interface 971, which is discussed further below. In some embodiments, the spacer 962 is machined into the wafer carrier edge 952 making it integral with its structure. In some embodiments, the wafer carrier 954 is graphite, and the spacer 962 is machined directly into the graphite and the entire wafer carrier 954 is then coated with a different material, such as silicon carbide (SiC). In some embodiments, two or more spacers are used to form a stable contact with the edge 958 of the rotating tube 960. The system shown in FIG. 9B is similar to that shown in FIG. 6A above and when the system of FIG. 9B rotates, it will essentially follow the description set out for FIGS. 6B and 6C above. The wafer carrier 954 does not have a pocket and can, therefore, be considered to be a pocketless carrier where the posts 972 retain wafer 970 on wafer carrier 954 during operation.

Figure 10:
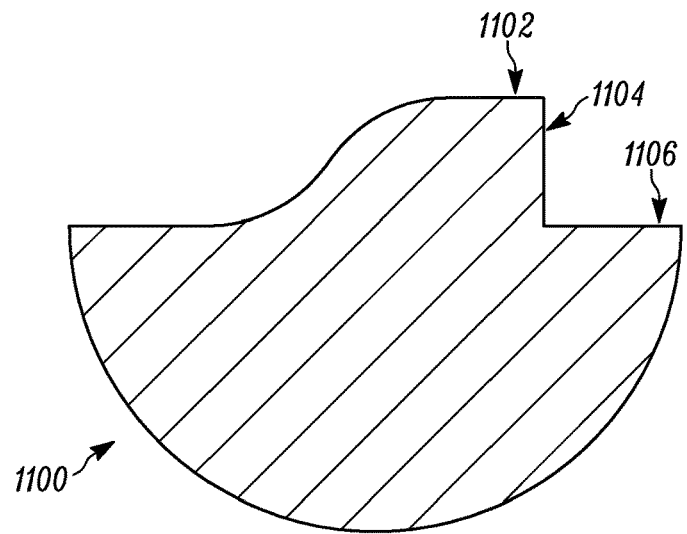
FIG. 10 shows other details of various embodiments of the post and the contact interface shown in FIGS. 9A and 9B including details of the wafer, the wafer carrier, and the post interface of the wafer carrier.
Figure 11:
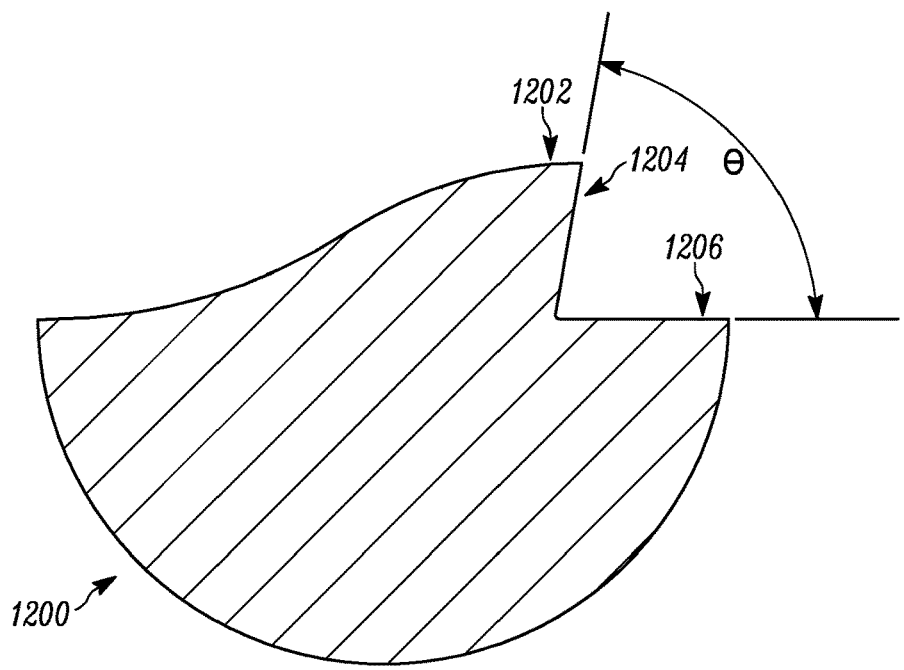
FIG. 11 shows yet other details of various embodiments of the post and the contact interface as shown in FIGS. 9A and 9B including details of the wafer, the wafer carrier, and the post interface of wafer carrier.

FIGS. 10 and 11 show details of post 920 or 972 and contact interface 921 or 971 as shown in FIGS. 9A and 9B above. See dotted circles F and G, respectively. In FIG. 10, item 1100 shows the detail of wafer, wafer carrier, and post interface of wafer carrier 902 or 954 mentioned above. Item 1102 is post 920 or 972 mentioned above. Item 1106 is a portion of wafer carrier 902 or 954, respectively, on which wafer 908 or 970, respectively, rests. Item 1104 is a wall of post 920 or 972 that forms the contact interface 921 or 971 where wafer 908 or 970, respectively, contacts post 920 or 972 (similar to item 1102). The face of item 1104, which interfaces with the wafer edge, can be flat or curved (for example, convex).

In FIG. 11, surface 1200 shows the detail of the wafer, the wafer carrier, and the post interface of the wafer carrier 902 or 954 described in connection with FIGS. 9A, 9B, respectively. Surface 1202 is the post 920 or 972. In this embodiment, surface 1204 is an undercut wall of the post 920 or 972 that forms contact interface 921 or 971, related to FIGS. 9A and 9B, respectively. Surface 1206 is a portion of the wafer carrier 902 or 954, respectively, on which the wafer 908 or 970, respectively, rests. Surface 1204 and surface 1206 form an angle Θ, which can range from about 80° to about 95°.

Figure 12:
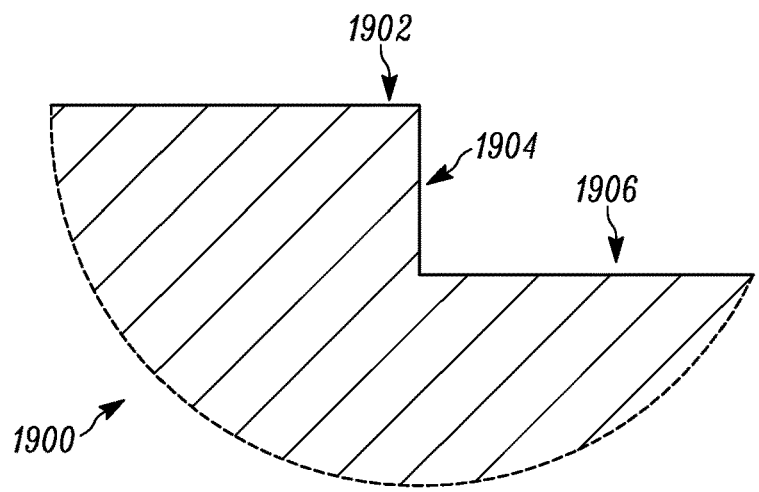
FIG. 12 shows other details of various embodiments of bumper and contact interface as in FIGS. 4A, 5A-C, and 6A including details of the wafer, the wafer carrier, and bumper interface of wafer carrier.
Figure 13:
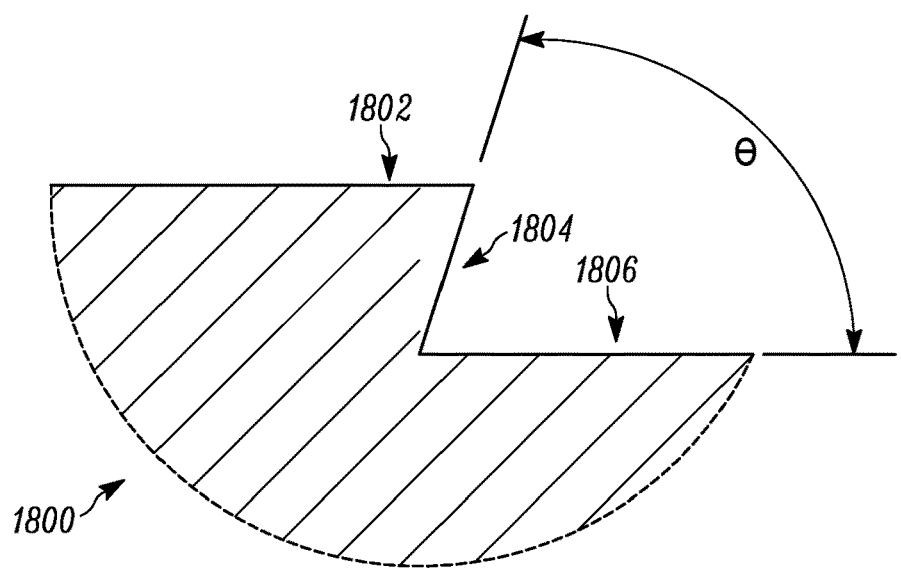
FIG. 13 shows other details of various embodiments of bumper and contact interface as in FIGS. 4A, 5A-C, and 6A including details of wafer, wafer carrier, and the bumper interface of the wafer carrier.

FIGS. 12 and 13 show details of various embodiments of sidewalls and contact interface 421 or 621 as described in connection with FIGS. 4A and 6A. In FIG. 12, surface 1900 shows the detail of the wafer carrier and the sidewall of the wafer carrier 402 or 604 described in connection with FIGS. 4A and 6A. Surface 1902 is the top face of wafer carrier 402 or 604 as shown in FIGS. 4A and 6A. Surface 1906 is a portion of pocket 420 or 624 of wafer carrier 402 or 604, respectively, on which wafer 408 or 620, respectively, rests. Surface 1904 is a bumper formed in the sidewall 424 or 626 of wafer carrier 402 or 604, respectively, which forms contact interface 421 or 621 when wafer 408 or 620, respectively, is placed in pocket 420 or 624. The face of item 1904, which interfaces with the wafer edge, can be flat or curved (for example, convex).

In FIG. 13, item 1800 shows the detail of wafer carrier and sidewall of wafer carrier 402 or 604 described in connection with FIGS. 4A and 6A. Surface 1802 is the top face of wafer carrier 402 or 604 as mentioned above. In this embodiment, surface 1804 is a bumper formed in the sidewall 424 or 626 of wafer carrier 402 or 604, respectively and is undercut so as to form contact interface 421 or 621, as shown in FIGS. 4A and 6A, respectively. Item 1806 is a portion of pocket 420 or 624 of wafer carrier 402 or 604, respectively, on which wafer 408 or 620, respectively, rests. Surface 1804 and surface 1806 form an angle Θ, which can range from about 80° to about 95°. The entire sidewall 424 or 626 of FIGS. 4A and 6A are not undercut. The undercut portion of pocket 420 or 624 is only formed when bumpers are formed within the respective pockets.

Figure 14:
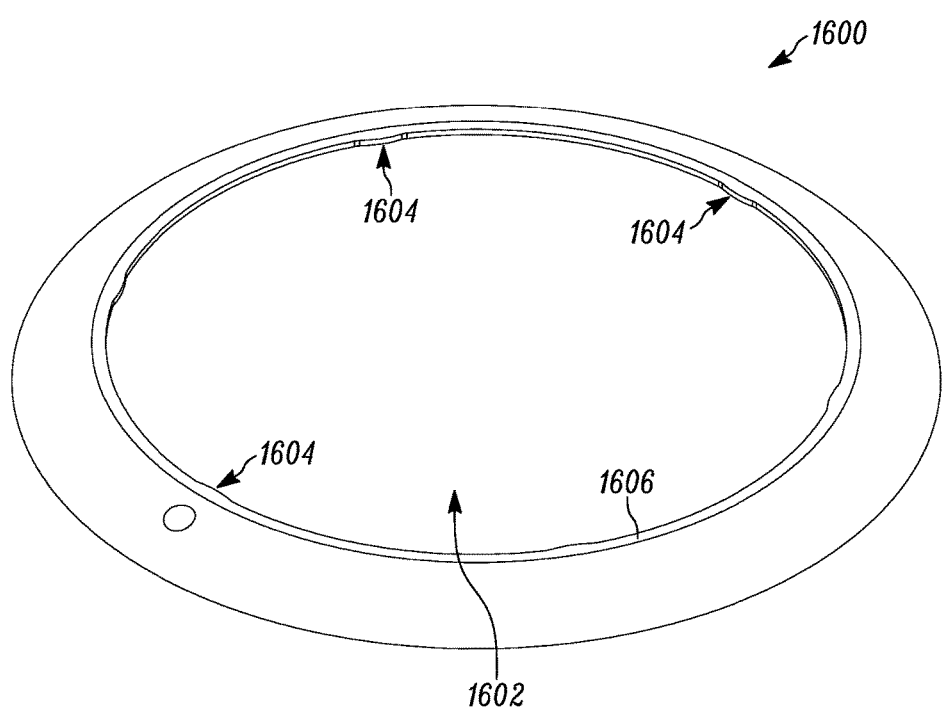
FIG. 14 shows an isometric view of a wafer carrier having a pocket having one or more bumpers.

FIG. 14 shows an isometric view of a wafer carrier 1600 having a pocket 1602 having one or more bumpers 1604, such as the bumpers described in connection with FIGS. 12 and 13. The wall 1606 of pocket 1602 has one or more bumpers 1604 formed on it.

Figure 15:
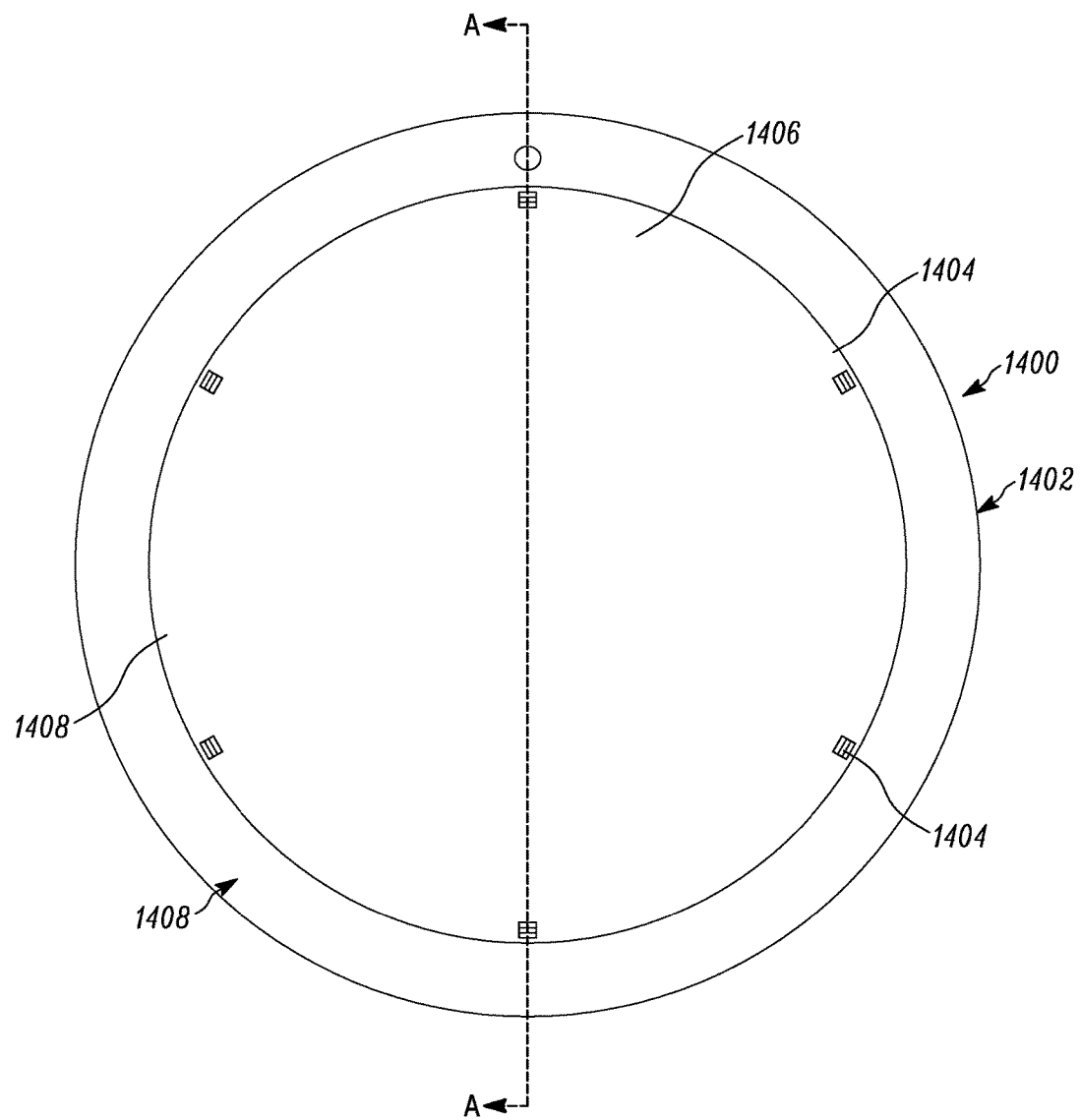
FIG. 15 shows a plan view of a pocketless wafer carrier according to the present teaching.

FIG. 15 shows plan view of another pocketless wafer carrier 1400 according to the present teaching. Pocketless wafer carrier 1400 has rim 1402 and posts 1404. Posts 1404 are similar to those posts described in FIGS. 10 and 11. Pocketless wafer carrier 1400 has surface 1408 on which wafer 1406 rests.

Figure 15A:
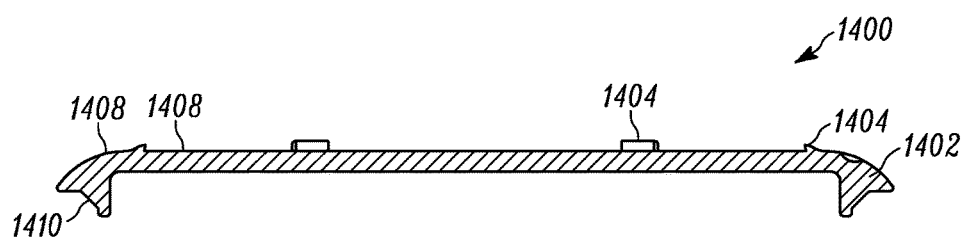
FIG. 15A is a cross-section view of the pocketless wafer carrier of FIG. 15 along line A-A.

FIG. 15A shows a cross-sectional view of pocketless wafer carrier 1400. Pocketless wafer carrier 1400 has an edge 1410 having a bevel geometry and a rim 1402, similar to the edge and rim as described in connection with FIG. 4A. The bevel geometry of edge 1410 forms a similar angle α, similar to angle α 418 described in connection with 4A, with a rotating tube of a reactor in which pocketless wafer carrier 1400 is utilized. The rotating tube is similar to the rotating tube 412 described in connection with FIG. 4A.

Figure 15B:
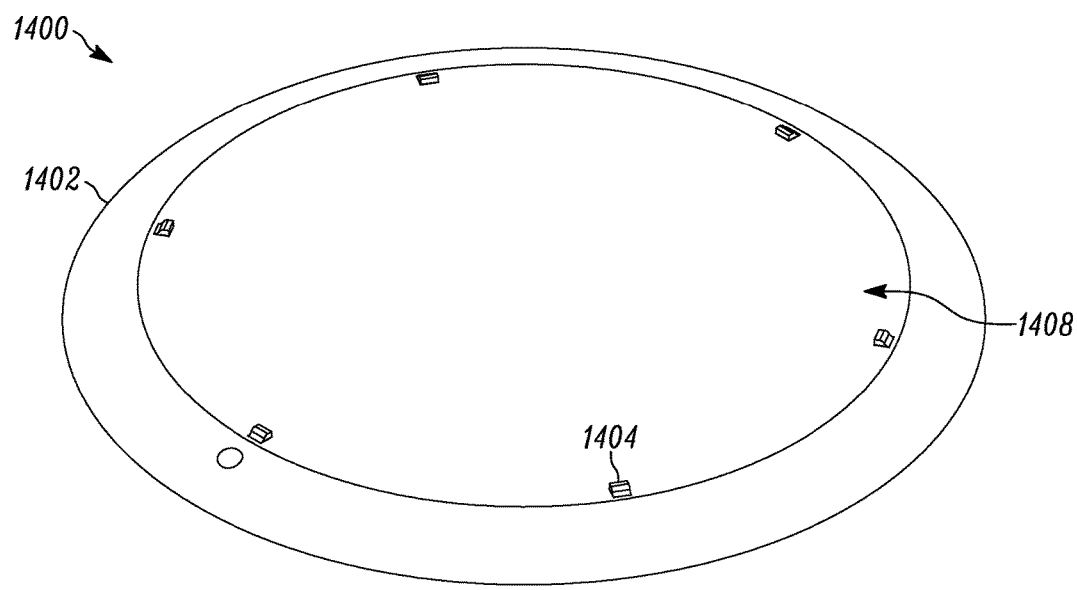
FIG. 15B is an isometric view of the pocketless wafer carrier of FIG. 15.

FIG. 15B shows an isometric view of pocketless wafer carrier 1400 according to the present teaching. The pocketless wafer carrier 1400 has rim 1402 and posts 1404. Posts 1404 are similar to those posts described in connection with FIGS. 10 and 11. The pocketless wafer carrier 1400 has surface 1408 on which a wafer (not shown) rests.

Figure 16:
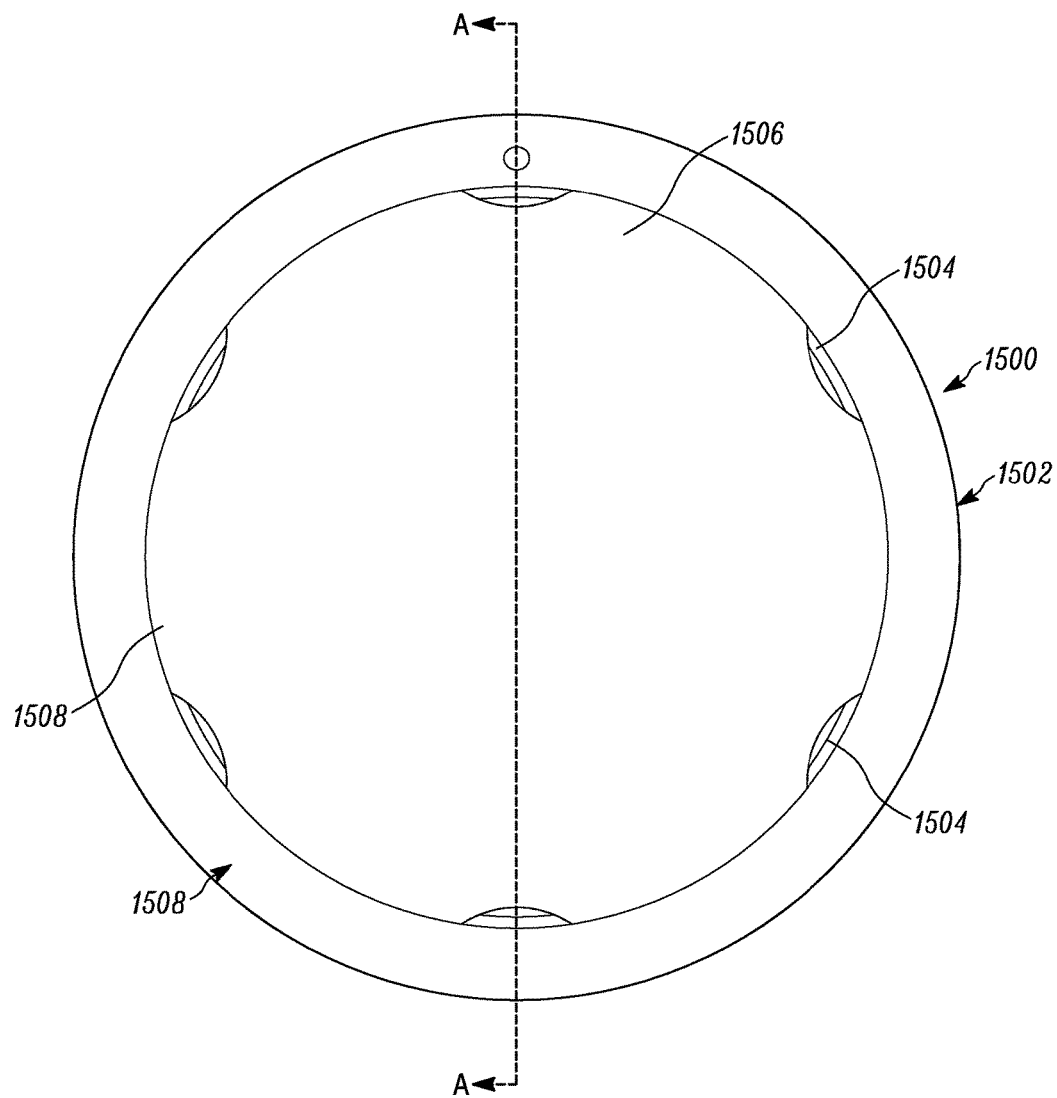
FIG. 16 shows a plan view of another pocketless wafer carrier according to the present teaching.

FIG. 16 shows a plan view of another pocketless wafer carrier 1500 according to the present teaching. Pocketless wafer carrier 1500 has rim 1502 and posts 1504, which are similar to posts described in FIGS. 10 and 11. Pocketless wafer carrier 1500 has surface 1508 on which a wafer 1506 rests.

Figure 16A:
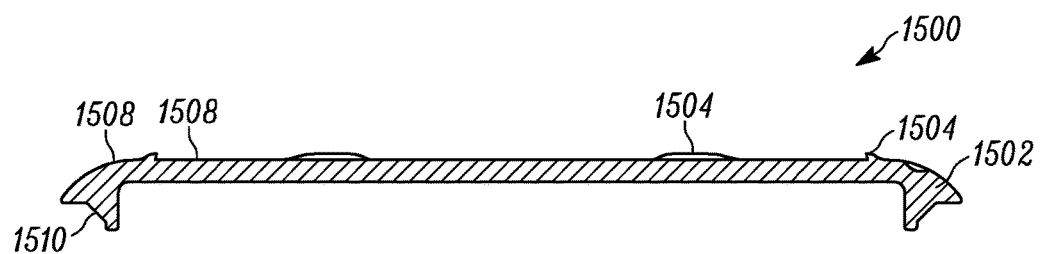
FIG. 16A is a cross-section of the pocketless wafer carrier of FIG. 16 along line A-A.

FIG. 16A shows a cross-section of pocketless wafer carrier 1500. Pocketless wafer carrier 1500 has an edge 1510 having a bevel geometry and a rim 1502, similar to the edge and rim as described in connection with FIG. 4A. The bevel geometry of edge 1510 forms a similar angle α, similar to angle α 418 as described above, with a rotating tube of a reactor in which pocketless wafer carrier 1500 is utilized. The rotating tube is similar to the rotating tubes described herein, such as rotating tube 412.

Figure 16B:
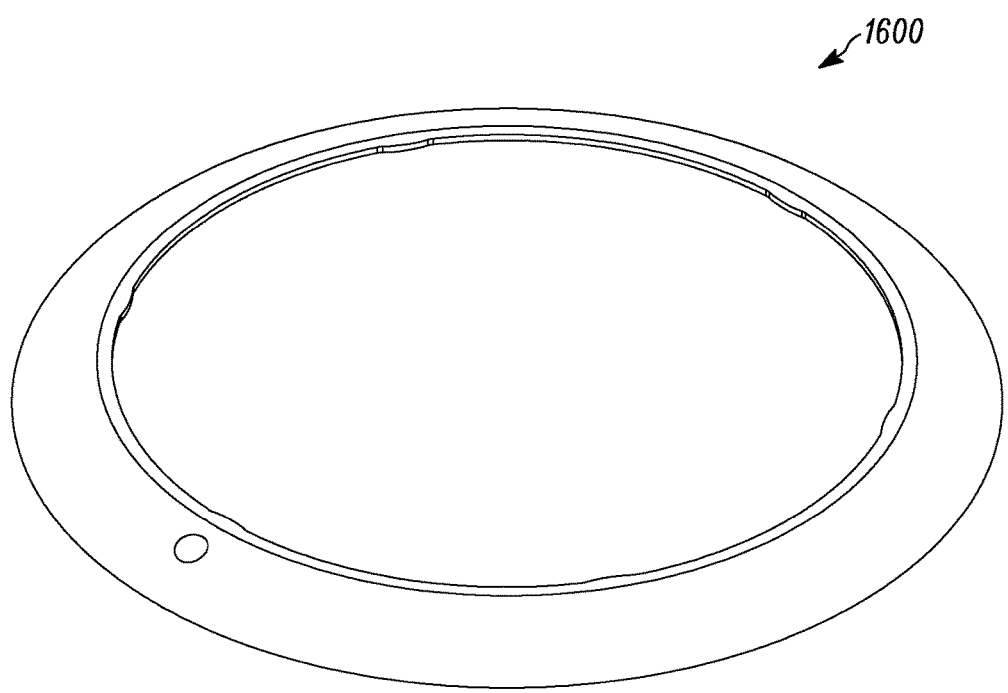
FIG. 16B is an isometric view of the pocketless wafer carrier of FIG. 16.

FIG. 16B shows an isometric view of the pocketless wafer carrier 1600 according to the present teaching. Referring to FIGS. 16 and 16A, pocketless wafer carrier 1500, 1600 has rim 1502 and posts 1504, which are similar to posts described in FIGS. 10 and 11. Pocketless wafer carrier 1500 has surface 1508 on which a wafer (not shown) rests.

Figure 17:
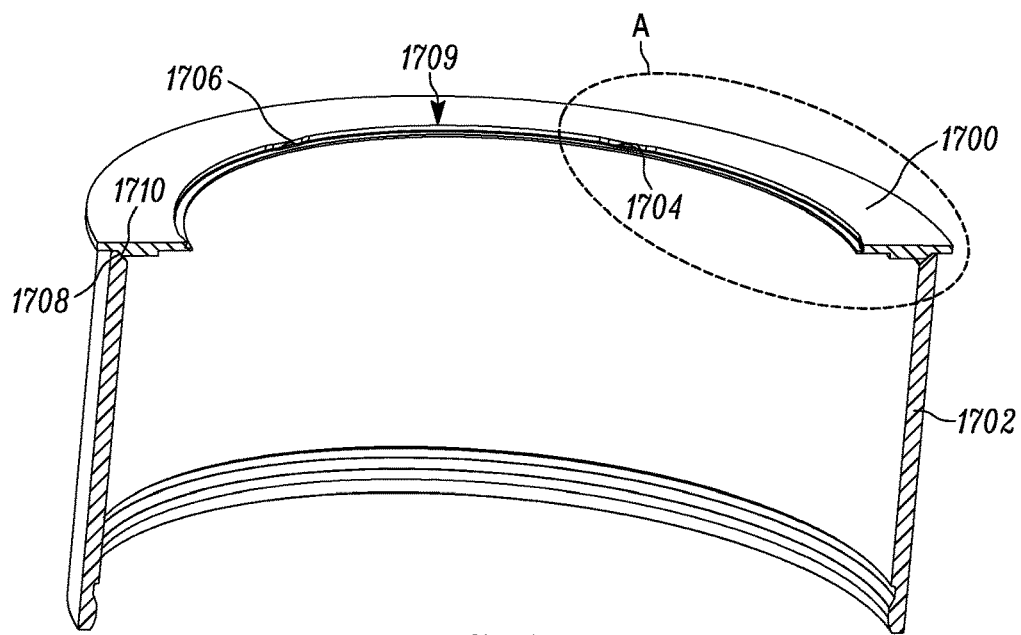
FIG. 17 is a cross-section view of a wafer support ring mounted on rotating drum according to the present teaching.

FIG. 17 is a cross-section view of wafer support ring 1700 (also called an open carrier) mounted on rotating drum 1702. Wafer support ring 1700 has edge 1710 and rotating drum 1702 has edge 1708 such that the geometry of edge 1710 and 1708 are proximate and parallel when wafer support ring 1700 is positioned on rotating drum 1702. The geometry is such that wafer support ring 1700 rotates synchronously with rotating drum 1702 at all temperatures. Wafer support ring 1700 has top face 1709 and an edge 1706 on which the outer edge of a wafer (not shown) rests. Wafer support ring 1700 also includes one or more bumpers 1704, where the bumpers have a straight wall or undercut and are similar to those described in FIGS. 12 and 13. Wafer support ring 1700 can also have a configuration wherein top face 1709 and edge 1706 are coplanar, forming a pocketless configuration, and uses posts, similar to 1404 or 1504. Wafer support ring 1700 can also be used in the self-centering CVD systems as shown in FIGS. 8A to 8G. When the wafer support ring 1700 is of a pocketless configuration, the face of the posts that contact the wafer edge can be flat or curved (for example, convex).

Figure 17A:
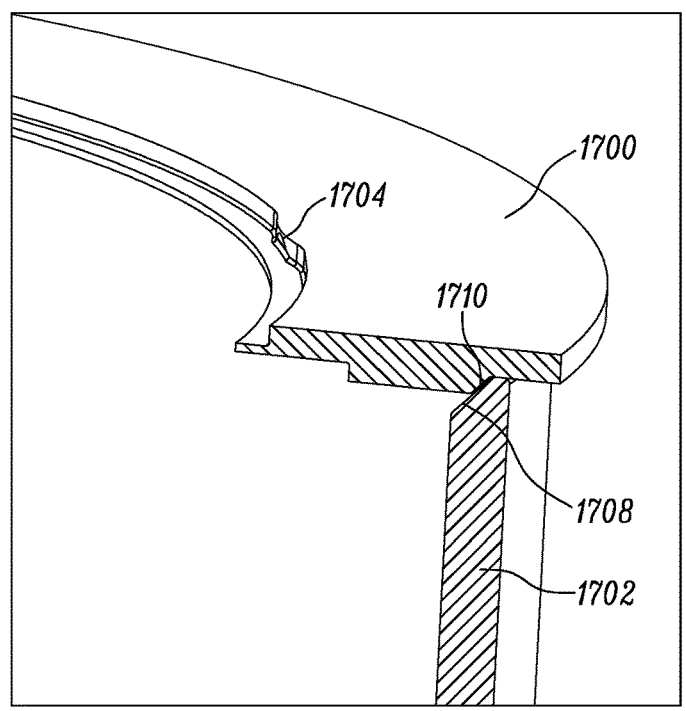
FIG. 17A illustrates an enlarged portion of FIG. 17.

FIG. 17A shows a close-up view of circle A in FIG. 17.

Figure 18:
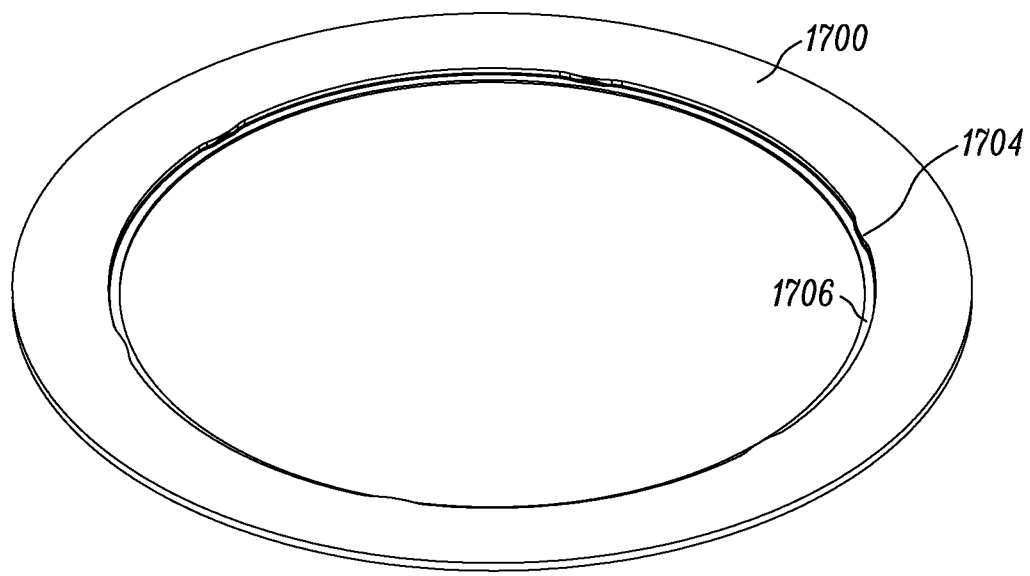
FIG. 18 illustrates an isometric view of a wafer support ring.

FIG. 18 shows an isometric view of wafer support ring 1700 having edge 1706 and bumper 1704 as described herein.

As discussed hereinabove, posts, for example, post 920 or 972, are formed on pocketless carriers as described above. For wafer carriers having pockets, bumpers are used.

Posts, when used on pocketless wafer carriers, or bumpers when used on a wafer carrier having a pocket, are generally placed symmetrically on the surface of pocketless wafer carrier or within the pocket of the wafer carriers. In general, six bumpers or posts are contemplated, but fewer, for example 3 or 4, or greater, for example 9 or 10, bumpers or posts can be used.

The undercuts, as shown in FIGS. 11 and 13, when used for posts or bumpers, range from about 80 to about 95°. The surfaces of items 1204 and 1804 which contact the edge of the wafer can be flat or curved (for example, convex). In other embodiments, the posts can be concave.

The surface of the bumpers or posts, for example, in FIGS. 10 and 12, that contact the edge of the wafer can be flat or curved (for example, convex). In other embodiments, the posts can be concave.

The materials used to form the bumpers or posts are typically the same material from which the wafer carrier is made. In other embodiments, the bumper or post can be formed from the same material from which the wafer is formed. In yet another embodiment, the bumper or post can be made of a material which is different from that of the wafer carriers and wafers.

In addition to bumpers or posts, the wafer carriers of the present invention can also have tabs. The tabs can be formed on surface 1408 or 1508, for example, in pocketless wafer carriers, at various locations on the surface circumferential near the posts. The tabs can be placed near the location of the posts or anywhere circumferential. When there are pockets in the wafer carrier, the tabs can be located on surface 1806 or 1906 where the bumpers are located or anywhere else within along the outside of the pocket in the recess.

In both instanced, the tabs may be triangular in shape. The tabs can be formed of a material that absorbs at least some of the force generated when the substrate carrier expands against the substrate. Also, the tabs can reduce mechanical stresses on the substrate as the temperature of the substrate carrier increases.

Figure 19:
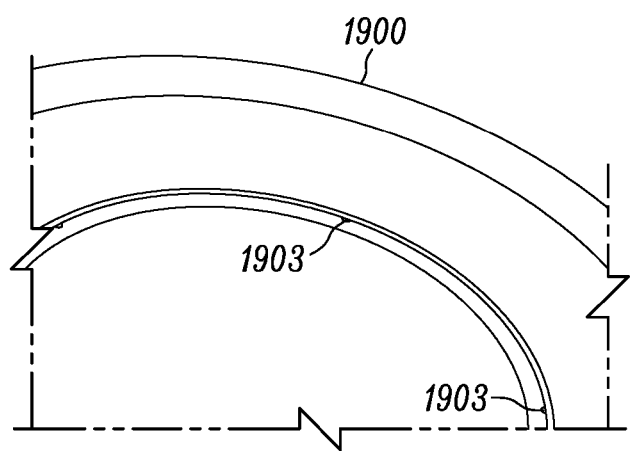
FIG. 19 illustrates an expanded top-view of a single substrate carrier, according to the present teaching.

FIG. 19 illustrates an expanded top-view 1900 of the single substrate carrier 1600 according to the present teaching, which was described in connection with FIG. 14 (with some features of FIG. 14 not being shown). The expanded top view 1900 shows a plurality of tabs 1903 that are used to support the substrate. The substrate rests on these tabs 1903 during processing. Numerous types of tabs can be used. For example, the tabs 1903 can be triangular-shaped tabs 1903, as shown, but other shapes can be contemplated, that are positioned at several locations along the edge of the substrate carrier 1600. This is because the substrate carrier 1600 expands as its temperature is ramped to the desired processing temperature, while the dimensions of many types of substrates remain essentially the same. The tabs 1903 are dimensioned so that they support the substrate over the entire operating temperature range of the processes.

The present invention also provides a single wafer substrate carrier for a chemical vapor deposition system where the single wafer substrate carrier has a body (wafer carrier) which is adapted to receive a substrate (or wafer) and an edge geometry for positioning on top of a rotating tube, the rotating tube also having an edge geometry, wherein the edge geometries of the single wafer substrate carrier and the rotating tube being chosen to provide a coincident alignment of a central axis of the wafer carrier and a rotation axis of the rotating tube during process at a desired process temperature. The wafer (or substrate) can be received on the body by using either a pocket (for example, pocket 420 or pocket 624 as described in connection with FIGS. 4A and 6B) or not using a pocket, i.e., pocketless, by using two or more bumpers or posts as discussed herein.

The single wafer substrate carrier is also known as a wafer carrier and the terms are interchangeable herein.

Figure 20:
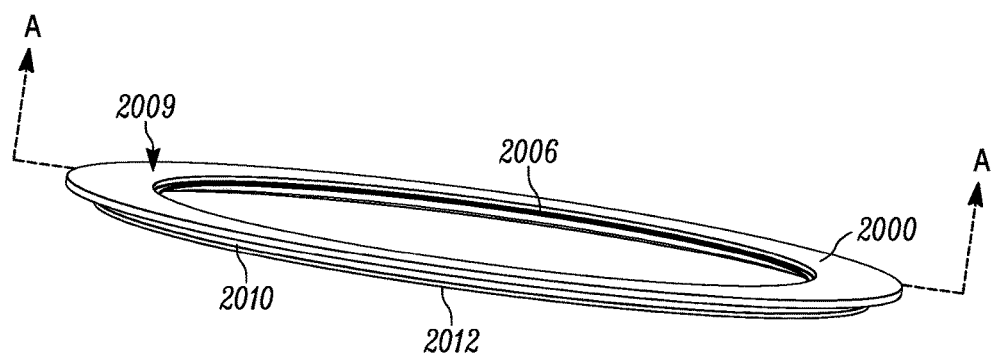
FIG. 20 illustrates an isometric view of another wafer support ring embodiment according to the present teaching.

FIG. 20 shows an isometric view of wafer support ring (also called an open carrier or process tray) 2000. Wafer support ring 2000 has edge 2006 on which the outer edge of a wafer (not shown) rests. Wafer support ring 2000 can also have one or more bumpers, where the bumpers have a straight wall or undercut and are similar to those described in FIGS. 12 and 13. Wafer support ring 2000 can also have a configuration where top face 2009 and edge 2006 are coplanar, forming a pocketless configuration, and uses posts, similar to 1404 or 1504 as discussed above. Wafer support ring 2000 can also be used in the self-centering CVD systems as shown in FIGS. 8A to 8G. When the wafer support ring 2000 is of a pocketless configuration, the face of the posts that contact the wafer edge can be flat or curved (for example, convex).

Figure 20A:
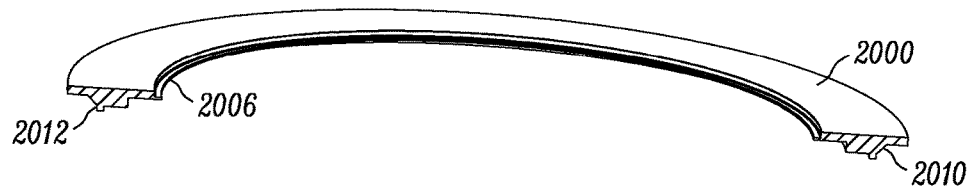
FIG. 20A illustrates a cross-section of the wafer support ring of FIG. 20 along line A-A.

FIG. 20A is a cross-section of FIG. 20 through line A-A.

Figure 21:
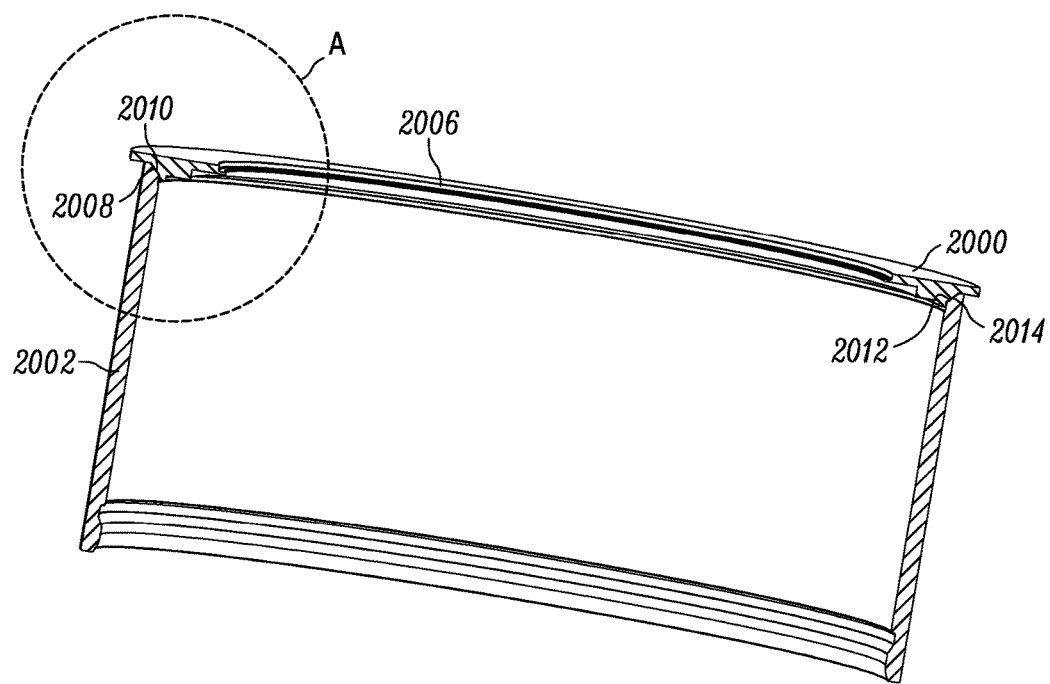
FIG. 21 illustrates a cross-section of the wafer support ring of FIG. 20 mounted on a rotating drum according to the present teaching.

FIG. 21 shows a cross-section of wafer support ring 2000 mounted on rotating drum 2002. Wafer support ring 2000 has an edge 2010 and an edge 2012. Rotating drum 2002 has an edge 2008 and 2014. The geometries of edge 2010 of wafer support ring 2000 and edge 2008 of rotating drum 2002 are proximate and parallel and the geometries of edge 2012 of wafer support ring 2000 and edge 2014 of rotating drum are proximate and parallel when wafer support ring 2000 is positioned on rotating drum 2002. The geometries are such that wafer support ring 2000 rotates synchronously with rotating drum 2002 at all temperatures. Edge 2012 can extend along edge 2014 of rotating drum 2002 from about 0.5 mm to about 7.5 mm.

Figure 21A:
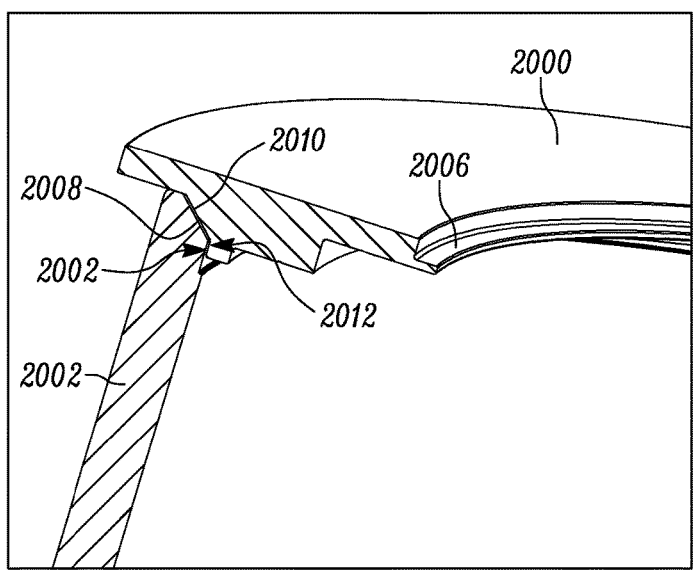
FIG. 21A illustrates an enlarged portion of FIG. 21.

FIG. 21A shows a close-up view of circle A in FIG. 21.

Figure 22:
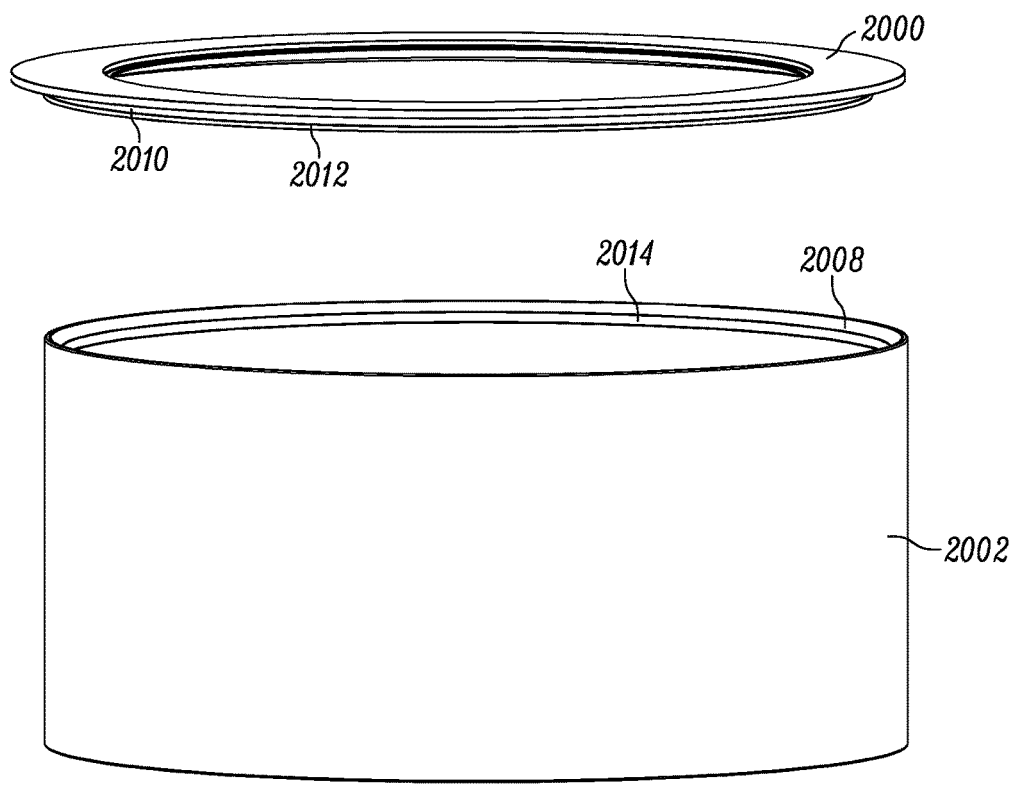
FIG. 22 illustrates an exploded view of the wafer support ring and rotating drum of FIG. 21 according to the present teaching.

FIG. 22 shows an exploded view of wafer support ring 2000 and rotating drum 2002.

EQUIVALENTS

While the Applicant's teaching is described in conjunction with various embodiments, it is not intended that the Applicant's teaching be limited to such embodiments. On the contrary, the Applicant's teaching encompass various alternatives, modifications, and equivalents, as will be appreciated by those of skill in the art, which may be made therein without departing from the spirit and scope of the teaching.

What is claimed is:

1. A self-centering wafer carrier system for a chemical vapor deposition (CVD) reactor, the wafer carrier system comprising:
   a) a wafer carrier comprising an edge and a pocket adapted to hold a wafer, the wafer carrier at least partially supporting a wafer for CVD processing; and
   b) a rotating tube comprising an edge, an edge geometry of the wafer carrier and an edge geometry of the rotating tube being chosen to provide a coincident alignment of a central axis of the wafer carrier and a rotation axis of the rotating tube during process at a desired process temperature.

2. The self-centering wafer carrier system of claim 1 wherein the wafer carrier supports an entire bottom surface of the wafer.

3. The self-centering wafer carrier system of claim 1 wherein the wafer carrier supports the wafer at a perimeter of the wafer, leaving a portion of both a top and a bottom surface of the wafer exposed.

4. The self-centering wafer carrier system of claim 3 further comprising a separator that provides radiant heating to the wafer.

5. The self-centering wafer carrier system of claim 4 wherein the separator comprises a geometry chosen to provide centering of the separator with respect to the center of the rotating tube.

6. The self-centering wafer carrier system of claim 4 wherein the separator comprises a geometry chosen to cause the separator to remain static with respect to the rotating tube during rotation.

7. The self-centering wafer carrier system of claim 4 wherein the separator comprises a material selected from the group consisting of silicon carbide and quartz.

8. The self-centering wafer carrier system of claim 4 further comprising a tube that supplies positive pressure purge gas to the cavity.

9. The self-centering wafer carrier system of claim 1 wherein a rotation eccentricity of the wafer is substantially zero at the desired process temperature.

10. The self-centering wafer carrier system of claim 1 wherein the wafer carrier edge and the rotating tube edge are dimensioned to define a gap.

11. The self-centering wafer carrier system of claim 10 wherein a width of the gap approaches zero at the desired process temperature.

12. The self-centering wafer carrier system of claim 10 wherein a width of the gap changes during heating due to a difference between a coefficient of thermal expansion of the material forming the wafer carrier and a coefficient of thermal expansion of the material forming the rotating tube.

13. The self-centering wafer carrier system of claim 10 wherein a width of the gap at room temperature is chosen so that there is space for expansion of the wafer carrier relative to the rotating tube at processing temperatures.

14. The self-centering wafer carrier system of claim 1 wherein the coincident alignment of the central axis of the wafer carrier and the rotation axis of the rotating tube during processing at the desired process temperature establishes an axial-symmetrical temperature profile across the wafer.

15. The self-centering wafer carrier system of claim 1 wherein a material forming at least one of the wafer carrier and the rotating tube is chosen to have a coefficient of thermal expansion that maintains space for expansion of the wafer carrier relative to the rotating tube at processing temperatures.

16. The self-centering wafer carrier system of claim 1 wherein the edge geometry of the wafer carrier and the edge geometry of the rotating tube both defined matching bevel surfaces.

17. The self-centering wafer carrier system of claim 16 wherein the matching bevel surfaces are parallel.

18. The self-centering wafer carrier system of claim 17 wherein the matching bevel surfaces are at an angle $\alpha$ such that $\tan(\alpha) > f$, where f is a coefficient of friction between the wafer carrier and rotation tube.

19. The self-centering wafer carrier system of claim 1 wherein the edge geometry of the wafer carrier is beveled on an inner surface and the edge geometry of the rotating tube is beveled on an outer surface.

20. The self-centering wafer carrier system of claim 1 wherein the rotating tube comprises a flat rim.

21. The self-centering wafer carrier system of claim 1 wherein the edge geometry of the wafer carrier is beveled on an outer surface and the edge geometry of the rotating tube is beveled on an inner surface.

22. The self-centering wafer carrier system of claim 1 further comprising one or more bumpers which are symmetrically placed within the pocket.

23. The self-centering wafer carrier system of claim 1 wherein the wafer carrier comprises a pocketless wafer carrier having two or more posts which are symmetrically placed on the upper surface of the wafer carrier.

24. A self-centering wafer carrier system for a chemical vapor deposition (CVD) reactor, the wafer carrier system comprising:
   a) a wafer carrier comprising an edge geometry comprising a spacer, the wafer carrier at least partially supporting a wafer for CVD processing; and
   b) a rotating tube that supports the wafer carrier, the spacer in the wafer carrier edge geometry forcing both a center axis of the wafer carrier and an axis of rotation of the rotating tube to align at a desired process temperature.

25. The self-centering wafer carrier system of claim 24 wherein the wafer carrier further comprises a relief structure positioned opposite to the spacer, the relief structure shifting a center of mass of the wafer carrier.

26. The self-centering wafer carrier system of claim 25 wherein the relief structure comprises a relatively flat section.

27. The self-centering wafer carrier system of claim 24 wherein the spacer is dimensioned so that the rotation of the wafer has a desired eccentricity.

28. The self-centering wafer carrier system of claim 24 wherein the spacer is machined into an edge of the wafer carrier.

29. The self-centering wafer carrier system of claim 24 wherein the wafer carrier is formed from a ceramic material chosen from the group consisting of silicon carbide (SiC), boron nitride (BN), boron carbide (BC), aluminum nitride (AlN), alumina ($Al_2O_3$), sapphire, silicon, gallium nitride, gallium arsenide, quartz, graphite, graphite coated with silicon carbide (SiC), and combinations thereof.

30. The self-centering wafer carrier system of claim 29 wherein the ceramic material includes a refractory coating.

31. The self-centering wafer carrier system of claim 24 wherein the wafer carrier is formed from a refractory metal.

32. The self-centering wafer carrier system of claim 29 wherein the wafer carrier edge geometry comprises at least two spacers that form a contact with an edge of the rotating tube.

33. A single wafer substrate carrier for chemical vapor deposition comprising a wafer carrier adapted to receive a wafer, the wafer carrier having an edge geometry for positioning on top of a rotating tube and being configured to receive the wafer by using a pocket adapted to hold the wafer, the rotating tube also having an edge geometry, wherein the edge geometries of the single wafer substrate carrier and the rotating tube being chosen to provide a coincident alignment of a central axis of the wafer carrier and a rotation axis of the rotating tube during process at a desired process temperature.

34. The single wafer substrate carrier of claim 33 wherein the wafer carrier further comprises one or more bumpers symmetrically placed within the pocket.

35. The single wafer substrate carrier of claim 33 wherein the wafer carrier comprises a pocketless wafer carrier, the pocketless wafer carrier comprising two or more posts symmetrically placed on the upper surface of the wafer carrier.

36. The self-centering wafer carrier system of claim 1 wherein a sidewall of the pocket comprises a surface that forms a contact interface with the wafer.

37. The self-centering wafer carrier system of claim 36 wherein the surface comprises a flat surface.

38. The self-centering wafer carrier system of claim 36 wherein the surface comprises a curved surface.

39. The self-centering wafer carrier system of claim 36 wherein the surface comprises a convex surface.

40. The self-centering wafer carrier system of claim 36 wherein the surface comprises an undercut surface.

* * * * *